(12) United States Patent
Shin et al.

(10) Patent No.: US 10,770,123 B2
(45) Date of Patent: Sep. 8, 2020

(54) STORAGE DEVICE AND OPERATING METHOD OF STORAGE DEVICE

(71) Applicant: Samsung Electronics Co., Ltd., Suwon-si, Gyeonggi-do (KR)

(72) Inventors: Soong-Man Shin, Hwaseong-si (KR); Hyungjin Kim, Seoul (KR); YoungWook Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/834,595

(22) Filed: Mar. 30, 2020

(65) Prior Publication Data

US 2020/0227100 A1   Jul. 16, 2020

Related U.S. Application Data

(63) Continuation of application No. 15/995,533, filed on Jun. 1, 2018, now Pat. No. 10,607,672.

(30) Foreign Application Priority Data

Oct. 19, 2017   (KR) .................. 10-2017-0136044

(51) Int. Cl.
| G11C 7/00 | (2006.01) |
| G11C 7/22 | (2006.01) |
| G06F 13/16 | (2006.01) |
| G11C 7/10 | (2006.01) |
| G11C 8/18 | (2006.01) |

(52) U.S. Cl.
CPC .......... *G11C 7/222* (2013.01); *G06F 13/1689* (2013.01); *G11C 7/1066* (2013.01); *G11C 7/1093* (2013.01); *G11C 8/18* (2013.01)

(58) Field of Classification Search
CPC ......... G11C 7/222; G11C 7/1066; G11C 8/18; G11C 7/1093; G06F 13/1689
See application file for complete search history.

(56) References Cited

U.S. PATENT DOCUMENTS

| 6,779,096 | B1 | 8/2004 | Cornelius et al. |
| 7,036,053 | B2 | 4/2006 | Zumkehr et al. |
| 7,171,321 | B2 | 1/2007 | Best |
| 8,689,159 | B1 | 4/2014 | Palmer et al. |
| 9,437,326 | B2 | 9/2016 | Razzaz et al. |
| 9,490,030 | B2 | 11/2016 | Kang et al. |
| 9,558,849 | B1 | 1/2017 | Fung et al. |
| 2011/0267117 | A1 | 11/2011 | Choi et al. |
| 2012/0250433 | A1 | 10/2012 | Jeon |
| 2014/0078840 | A1 | 3/2014 | Seo et al. |
| 2014/0337539 | A1* | 11/2014 | Lee ..................... G06F 3/0656 710/5 |

(Continued)

Primary Examiner — Uyen Smet
(74) Attorney, Agent, or Firm — Harness, Dickey & Pierce, P.L.C.

(57) ABSTRACT

A storage device including a nonvolatile memory device including memory blocks and a controller connected with the nonvolatile memory device through data input and output lines and a data strobe line may be provided. The nonvolatile memory device and the controller may be configured to perform training on the data input and output lines by adjusting a delay of a data strobe signal sent through the data strobe line and adjust delays of the data input and output lines based on the training result.

30 Claims, 20 Drawing Sheets

(56) References Cited

U.S. PATENT DOCUMENTS

2014/0355359 A1* 12/2014 Linam .................. H04L 7/0041
365/189.02
2018/0150100 A1    5/2018 Choi et al.
2018/0226108 A1*  8/2018 Kwon .................... G11C 16/10

* cited by examiner

STORAGE DEVICE AND OPERATING METHOD OF STORAGE DEVICE

CROSS-REFERENCE TO RELATED APPLICATIONS

This application is a continuation of U.S. application Ser. No. 15/995,533, filed on Jun. 1, 2018, which claims priority under 35 U.S.C. § 119 to Korean Patent Application No. 10-2017-0136044 filed Oct. 19, 2017, in the Korean Intellectual Property Office, the disclosure of each of which is incorporated by reference herein in its entirety.

BACKGROUND

Example embodiments of the inventive concepts relate to semiconductor memories, and in particular, to storage devices and/or an operating methods thereof.

The function of a semiconductor logic device is being improved as technologies for manufacturing the semiconductor logic device develop. In particular, as the function of the semiconductor logic device used as a memory controller is improved, a system in which one controller controls a plurality of semiconductor memory devices is being developed and used.

A controller and a memory device communicate with each other through data input and output lines. Training may be performed to improve reliability of data transmission between the controller and the memory device through the data input and output lines. The training includes aligning transmission and/or arrival timings of pieces of data sent in parallel through the data input and output lines.

The training improves reliability of data transmission. However, additional circuits or intellectual property blocks may be desired between the controller and the memory device to perform the training. Accordingly, devices and/or methods capable of reducing overhead of additional circuits or intellectual property blocks for the training may be desired while improving reliability of data transmission through the training.

SUMMARY

Example embodiments of the inventive concepts provide storage devices and/or operating methods thereof capable of improving reliability of data transmission through training while reducing overhead of circuits or intellectual property blocks for the training.

According to an example embodiment, a storage device includes a nonvolatile memory device including memory blocks and a controller connected with the nonvolatile memory device through data input and output lines and a data strobe line. The nonvolatile memory device and the controller may be configured to perform training on the data input and output lines by adjusting a delay of a data strobe signal sent through the data strobe line and adjust delays of the data input and output lines based on the training result.

According to an example embodiment, a storage device includes a nonvolatile memory device including memory blocks and a controller connected with the nonvolatile memory device through data input and output lines and a data strobe line. The controller may include a first delay element connected with the data strobe line, and second delay elements connected with the data input and output lines, respectively. A maximum delay of the first delay element may be greater than a maximum delay of each of the second delay elements.

According to an example embodiment, an operating method of a storage device which includes a nonvolatile memory device and a controller includes sending, at the controller, a first data strobe signal and first data bits to the nonvolatile memory device while adjusting a delay of the first data strobe signal, storing, at the nonvolatile memory device, the first data bits received from the controller as second data bits in synchronization with the data strobe signal, sending, at the nonvolatile memory device, a second data strobe signal and the second data bits to the controller, storing, at the controller, the second data bits received from the nonvolatile memory device in synchronization with the second data strobe signal, and adjusting, at the controller, first delays to send the first data bits to the nonvolatile memory device based on the second data bits stored at the controller.

BRIEF DESCRIPTION OF THE DRAWINGS

The above and other objects and features of the inventive concepts will become apparent by describing in detail some example embodiments thereof with reference to the accompanying drawings.

DETAILED DESCRIPTION

Below, some example embodiments of the inventive concepts may be described in detail and clearly to such an extent that an ordinary one in the art easily implements the inventive concepts.

Figure 1:
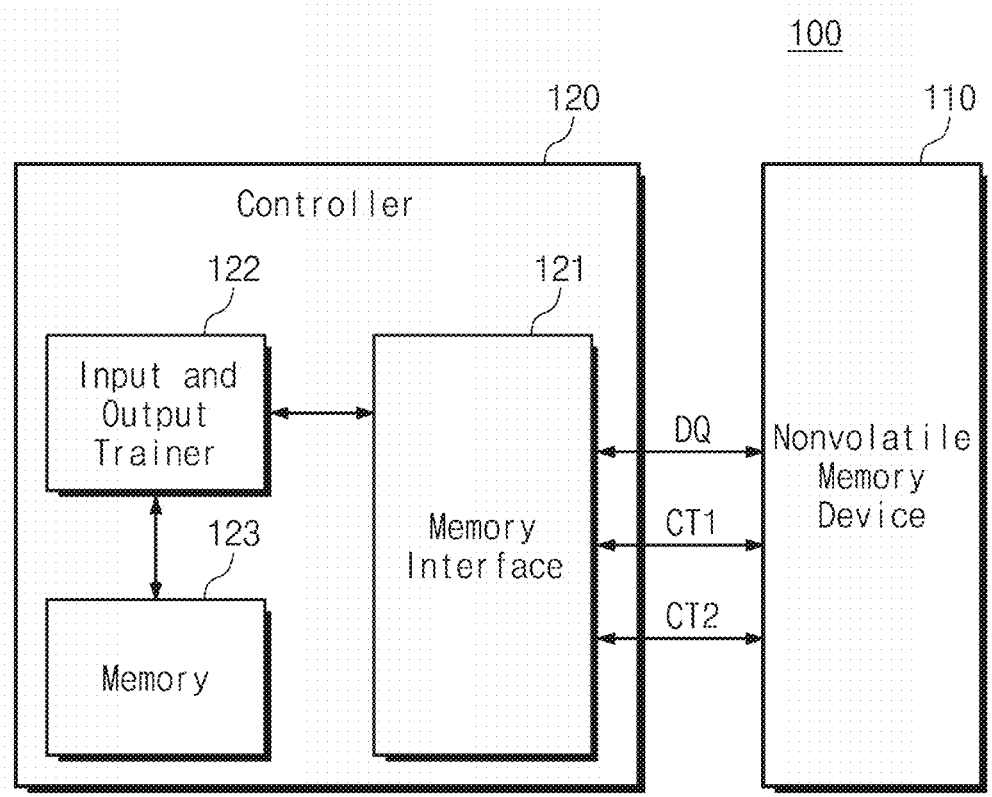
FIG. 1 is a block diagram illustrating a storage device according to an example embodiment of the inventive concepts.

FIG. 1 is a block diagram illustrating a storage device 100 according to an example embodiment of the inventive concepts. Referring to FIG. 1, the storage device 100 includes a nonvolatile memory device 100 and a controller 120. The nonvolatile memory device 100 may include various memories, for example, a flash memory, a phase-change random access memory (PRAM), a magneto-resistive RAM (MRAM), a resistive RAM (RRAM), or a ferroelectric RAM (FRAM).

The nonvolatile memory device 100 may include homogeneous memories or heterogeneous memories. The nonvolatile memory device 100 may communicate with the controller 120 through data input and output lines DQ, first control lines CT1, and second control lines CT2.

The data input and output lines DQ may be connected in common to the nonvolatile memory device 110. For example, a signal (e.g., a data bit) that is received from the controller 120 may be provided in common to a plurality of the nonvolatile memory devices 110 through one of the data input and output lines DQ.

The controller 120 may be configured to control the nonvolatile memory device 110. The controller 120 may allow the nonvolatile memory device 100 to perform a program, read, and/or erase operations. Also, the controller 120 may perform training with regard to the nonvolatile memory device 110.

The training may be performed after power is supplied to the storage device 100 or after the storage device 100 switches from a power saving mode to a normal mode. The training may be performed before the controller 120 starts to control the nonvolatile memory device 100 normally (e.g., before the controller 120 cause the nonvolatile memory device 100 to perform a program, read, and/or erase operations).

The controller 120 may include a memory interface 121, an input and output trainer 122, and a memory 123. The memory interface 121 may perform communication with the nonvolatile memory device 110. For example, the memory interface 121 may exchange signals having levels and timings defined by the specific protocol associated with the nonvolatile memory device 110.

The input and output trainer 122 may perform training with the nonvolatile memory device 100 through the memory interface 121. The input and output trainer 122 may store pieces of information as to which the training is desired and/or pieces of information (e.g., delays) obtained by the training. The input and output trainer 122 may perform training with regard to the nonvolatile memory device 100 by using the memory 123.

Figure 2:
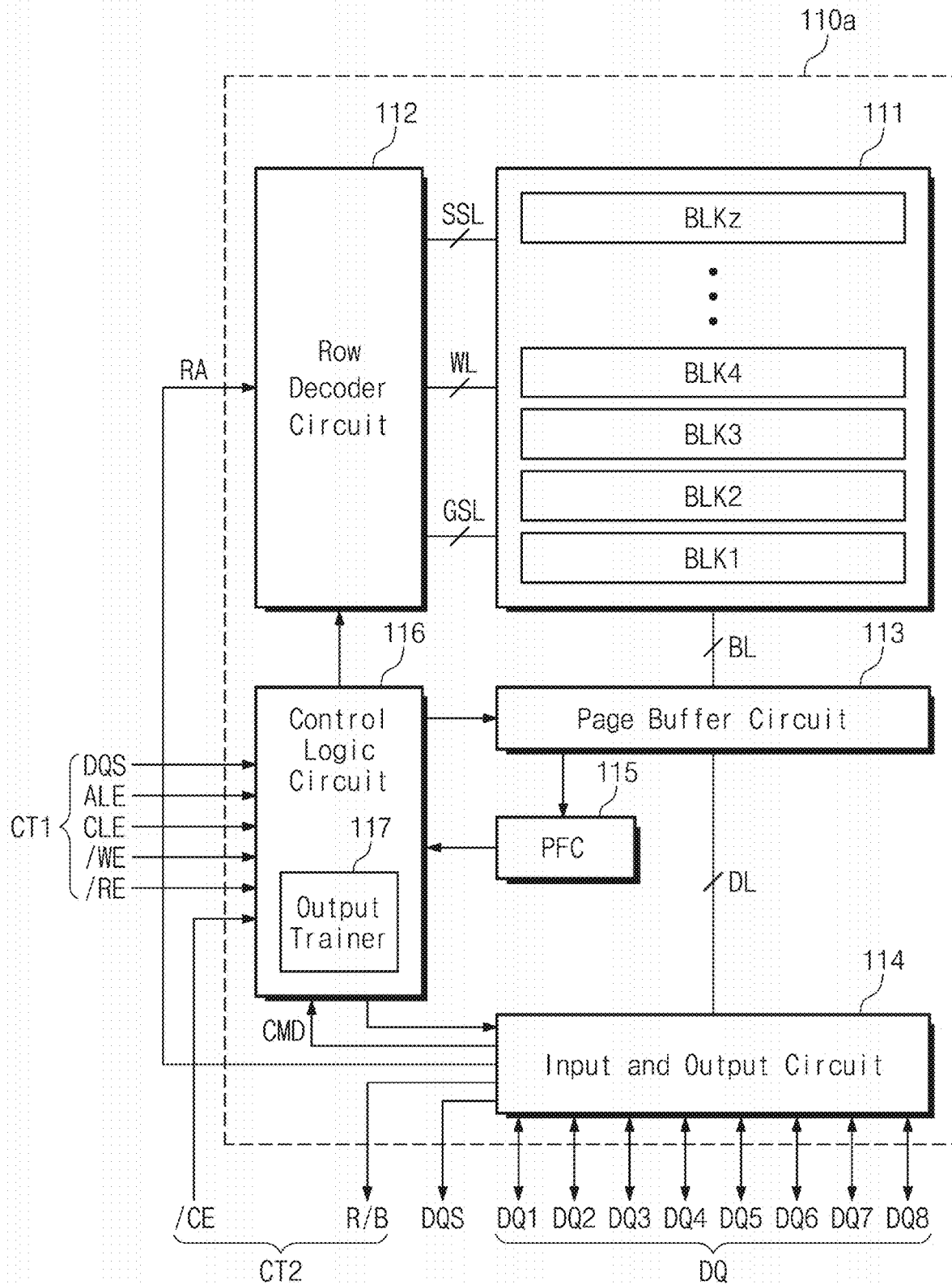
FIG. 2 is a block diagram illustrating a nonvolatile memory device included in the storage device of FIG. 1 according to an example embodiment of the inventive concepts.

FIG. 2 is a block diagram illustrating a nonvolatile memory device 110a included in the storage device of FIG. 1 according to an example embodiment of the inventive concepts. Referring to FIG. 2, the nonvolatile memory device 110a includes a memory cell array 111, a row decoder circuit 112, a page buffer circuit 113, an input and output circuit 114, a pass-fail check circuit (PFC) 115, and a control logic circuit 116.

The memory cell array 111 includes a plurality of memory blocks BLK1 to BLKz. Each of the memory blocks BLK1 to BLKz includes a plurality of memory cells. Each of the memory blocks BLK1 to BLKz may be connected to the row decoder circuit 112 through at least one ground selection line GSL, a plurality of word lines WL, and at least one string selection line SSL. Each of the memory blocks BLK1 to BLKz may be connected to the page buffer circuit 113 through a plurality of bit lines BL. The memory blocks BLK1 to BLKz may be connected in common to the bit lines BL.

In an example embodiment, each of the memory blocks BLK1 to BLKz may correspond to a unit of an erase operation. The memory cells of the memory cell array 111 may be erased for each memory block. The memory cells belonging to one memory block may be erased at the same time. As another example, each of the memory blocks BLK1 to BLKz may be divided into a plurality of sub-blocks. Each sub-block may correspond to a unit of an erase operation.

The row decoder circuit 112 may be connected to the memory cell array 111 through a plurality of ground selection lines GSL, the plurality of word lines WL, and a plurality of string selection lines SSL. The row decoder circuit 112 may operate under control of the control logic circuit 116. The row decoder circuit 112 may receive a row address RA from the input and output circuit 114. The row decoder circuit 112 may decode the received row address, and may control voltages to be applied to the string selection lines SSL, the word lines WL, and the ground selection lines GSL, respectively, based on the decoded address.

The page buffer circuit 113 may be connected to the memory cell array 111 through the bit lines BL. The page buffer circuit 113 may be connected with the input and output circuit 114 through a plurality of data lines DL. The page buffer circuit 113 may operate under control of the control logic circuit 116.

In a write operation, the page buffer circuit 113 may store data bits to be programmed in the memory cells. The page buffer circuit 113 may apply voltages to the bit lines BL based on the stored data bits. For example, the page buffer circuit 113 may function as a write driver. In a read operation or a verification read operation, the page buffer circuit 113 may sense voltages of the bit lines BL, and may store the sensed result. For example, the page buffer circuit 113 may function as a sense amplifier.

The input and output circuit 114 may be connected with the page buffer circuit 113 through the data lines DL. The input and output circuit 114 may be connected to the controller 120 through data input and output lines DQ (e.g., DQ1 to DQ8). The input and output circuit 114 may output data bits read by the page buffer circuit 113 to the controller 120 of the storage device 100 of FIG. 1 through the data input and output lines DQ1 to DQ8, and may send data bits received from the controller 120 to the page buffer circuit 113 through the data input and output lines DQ1 to DQ8.

The input and output circuit 114 may receive an address through the data input and output lines DQ1 to DQ8. The input and output circuit 114 may send a row address RA of the received address to the row decoder circuit 112. On the basis of a column address of the received address, the input and output circuit 114 may store data bits in the page buffer circuit 113 or may read data bits stored in the page buffer circuit 113.

The input and output circuit 114 may receive a command CMD through the data input and output lines DQ1 to DQ8. The input and output circuit 114 may send the received command CMD to the control logic circuit 116. The input and output circuit 114 may output a data strobe signal DQS to the controller 120. The input and output circuit 114 may output data bits through the data input and output lines DQ1 to DQ8 in synchronization with the data strobe signal DQS.

Below, for a brief description, signals that are received (input) or sent (output) through the data input and output lines DQ1 to DQ8 are referred to as data input and output signals, and are cited by using the same reference marks as the data input and output lines DQ1 to DQ8. The data input and output signals DQ1 to DQ8 are signals sent through the data input and output lines DQ1 to DQ8, respectively, and use the same reference marks as the data input and output lines DQ1 to DQ8.

The input and output circuit 114 may output a ready/busy signal R/B to the controller 120. For example, when the input and output circuit 114 is ready to receive a command, an address, or data bits from the controller 120, the input and output circuit 114 may output the ready/busy signal R/B indicating a ready state. When the input and output circuit 114 cannot receive a command, an address, or data bits from the controller 120, the input and output circuit 114 may output the ready/busy signal R/B indicating a busy state.

After the verification read operation, the pass-fail check circuit 115 may receive a sensing result from the page buffer circuit 113. The pass-fail check circuit 115 may determine pass or fail of the write or erase operation based on the received sensing result. The pass or fail determination result may be provided to the control logic circuit 116.

The control logic circuit 116 may receive the data strobe signal DQS, an address latch enable signal ALE, a command latch enable signal CLE, a write enable signal/WE, a read enable signal/RE, and a chip enable signal/CE from the controller 120.

For example, the data strobe signal DQS sent to the control logic circuit 116 from the controller 120 and the data strobe signal DQS that the input and output circuit 114 sends to the controller 120 may be bidirectional signals sent through the same control line. In a data read (e.g., output) operation, the data strobe signal DQS may be controlled by the nonvolatile memory device 110. In a data write (e.g., input) operation, the data strobe signal DQS may be controlled by the controller 120.

When the controller 120 sends data bits to the nonvolatile memory device 110a through the data input and output lines DQ1 to DQ8, the controller 120 may send the data strobe signal DQS. The control logic circuit 116 may allow the input and output circuit 114 to store (or latch) signals of the data input and output lines DQ1 to DQ8 at an appropriate timing in synchronization with the data strobe signal DQS.

When the nonvolatile memory device 110a sends data bits to the controller 120 through the data input and output lines DQ1 to DQ8, the input and output circuit 114 may send the data strobe signal DQS. The controller 120 may store (or latch) signals of the data input and output lines DQ1 to DQ8 at an appropriate timing in synchronization with the data strobe signal DQS.

The address latch enable signal ALE indicates that data bits input through the data input and output lines DQ1 to DQ8 are an address. If the address latch enable signal ALE is activated, the control logic circuit 116 may process the data bits input through the data input and output lines DQ1 to DQ8 as the address. For example, the control logic circuit 116 may control the input and output circuit 114 such that the row address RA is sent to the row decoder circuit 112.

The command latch enable signal CLE indicates that data bits input through the data input and output lines DQ1 to DQ8 are a command CMD. If the command latch enable signal CLE is activated, the control logic circuit 116 may process the data bits input through the data input and output lines DQ1 to DQ8 as the command CMD. For example, the control logic circuit 116 may fetch the command CMD stored in the input and output circuit 114, and execute the fetched command.

When the command CMD or an address is received through the data input and output lines DQ1 to DQ8, the write enable signal /WE may indicate a timing to store (or latch) data bits of the data input and output lines DQ1 to DQ8. The read enable signal /RE may be used for the controller 120 to provide any clock to the nonvolatile memory device 110a in a read (or output) operation.

For example, in the read operation, the controller 120 may toggle the read enable signal /RE between a high level and a low level, for example, periodically. The control logic circuit 116 may send the read enable signal /RE to the input and output circuit 114. The input and output circuit 114 may delay the read enable signal /RE to generate the data strobe signal DQS. The input and output circuit 114 may send data bits through the data input and output lines DQ1 to DQ8 in synchronization with the data strobe signal DQS.

The chip enable signal /CE may activate the nonvolatile memory device 110. The ready/busy signal R/B may be used to indicate whether the nonvolatile memory device 110a is in a ready state or in a busy state. The chip enable signal /CE and the ready/busy signal R/B may be sent through the second control lines CT2.

The data strobe signal DQS, the address latch enable signal ALE, the command latch enable signal CLE, the write enable signal /WE, and the read enable signal /RE may be conveyed through the first control lines CT1. A difference between the first control lines CT1 and the second control lines CT2 will be more fully described with reference to FIG. 19.

The control logic circuit 116 may include an output trainer 117. The output trainer 117 may perform training on data bits that the input and output circuit 114 outputs through the data input and output lines DQ1 to DQ8 in the read operation. The training will be more fully described later with reference to some accompanying drawings.

Figure 3:
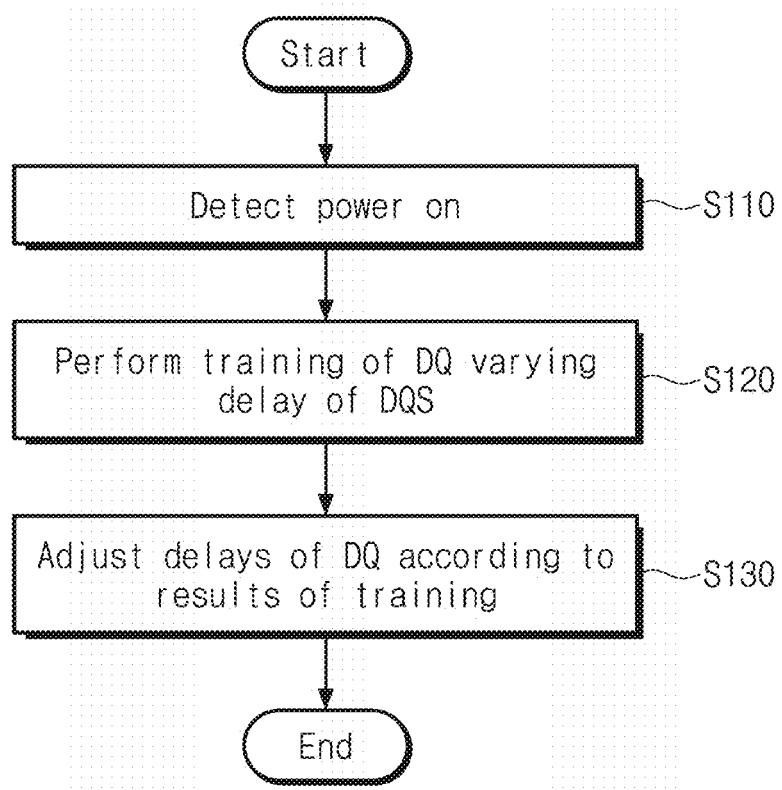
FIG. 3 is a flowchart illustrating an operating method of the storage device of FIG. 1 according to an example embodiment of the inventive concepts.

FIG. 3 is a flowchart illustrating an operating method of the storage device 100 of FIG. 1 according to an example embodiment of the inventive concepts. Referring to FIGS. 1 to 3, in operation S110, whether the storage device 100 is powered on or not may be detected. In some example embodiments, whether the controller 120 is powered on or not may be detected. As another example, the controller 120 may detect the event that the storage device 100 switches from a power saving mode to a normal mode and power is supplied.

In operation S120, the storage device 100 may perform training on the data input and output lines DQ while varying a delay of the data strobe signal DQS. For example, the storage device 100 may perform training by varying the delay of the data strobe signal DQS and sending data bits through the data input and output lines DQ.

In operation S130, the storage device 100 may adjust respective delays of the data input and output lines DQ based on the training result. For example, the storage device 100 may adjust the delays of the data input and output lines DQ such that centers of data bits sent through the data input and output lines DQ are aligned at a specific timing of the data strobe signal DQS.

For example, the training may include an output training operation (or a read training operation) and an input training operation (a write training operation). The output (or read)

training operation may be performed to detect and adjust delays (or transmission timings) when the nonvolatile memory device 110a sends the data strobe signal DQS to the controller 120 and sends data bits to the controller 120 through the data input and output lines DQ.

The input (or write) training operation may be performed to detect and adjust delays (or transmission timings) when the controller 120 sends the data strobe signal DQS to the nonvolatile memory device 110a and sends data bits to the nonvolatile memory device 110a through the data input and output lines DQ.

Figure 4:
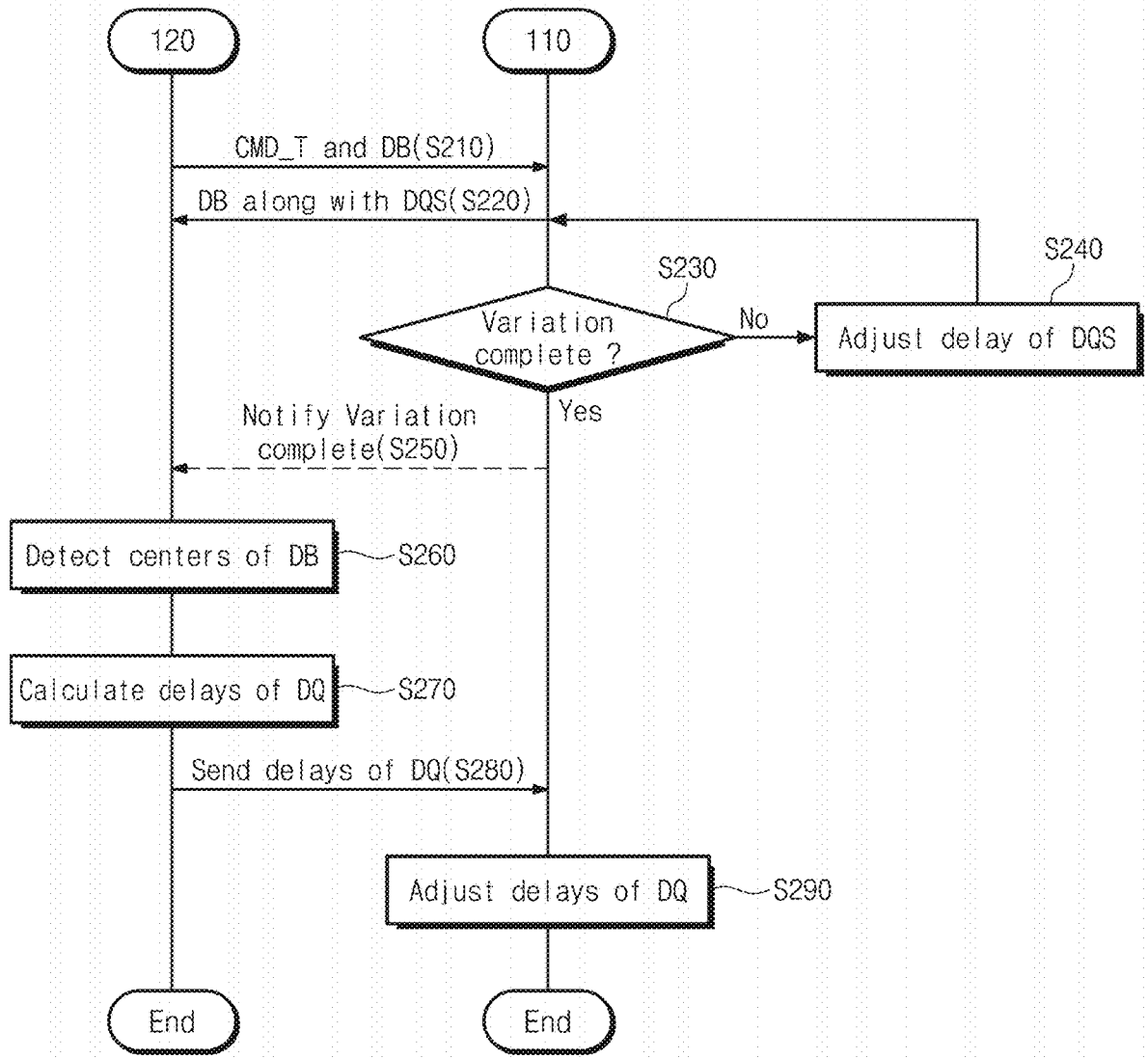
FIG. 4 is a flowchart illustrating an example in which the storage device performs input training.

FIG. 4 is a flowchart illustrating an example in which the storage device 100 performs input training (or write training). Referring to FIGS. 1, 2, and 4, in operation S210, the controller 120 may send a training command CMD_T and data bits DB to the nonvolatile memory device 110. The data bits DB may be bits, for example, prepared in advance for training, and may be read from the memory 123. The data bits DB may be sent in the form of a command.

In operation S220, the nonvolatile memory device 110a may send the data strobe signal DQS to the controller 120 in response to the training command CMD_T and the data bits DB, and may send the data bits DB to the controller 120 through the data input and output lines DQ.

In operation S230, the nonvolatile memory device 110a may determine whether a delay is completely varied. For example, when the delay of the data strobe signal DQS is varied as much as the given number of times in units of a unit delay or when the delay of the data strobe signal DQS is varied as much as a given delay, it is determined that the delay is completely varied.

If it is determined that the delay is not completely varied, in operation S240, the nonvolatile memory device 110a may adjust the delay of the data strobe signal DQS in units of the unit delay, and the procedure proceeds to operation S220. If it is determined that the delay is completely varied, in operation S250, the nonvolatile memory device 110a may notify the controller 120 that the delay is completely varied.

For example, the nonvolatile memory device 110a may notify the controller 120 that the delay is completely varied, by adjusting a level of the ready/busy signal R/B. In an example embodiment, operation S250 may be selectively performed. In this case, the controller 120 may be configured to receive the data bits DB and the data strobe signal DQS from the nonvolatile memory device 110a as much as the given number of times.

The controller 120 may repeatedly receive the data strobe signal DQS, the delay of which is varied, and the data bits DB from the nonvolatile memory device 110a until the delay is completely varied. The controller 120 may detect edges of the data bits DB based on the data strobe signal DQS and the data bits DB.

In operation S260, the controller 120 may detect the centers of the data bits DB from the edges of the data bits DB. In operation S270, the controller 120 may calculate delays (e.g., output delays or read delays) of the data input and output lines DQ.

In operation S280, the controller 120 may send the calculated delays of the input and output lines (e.g., transmission timings of the data bits DB) to the nonvolatile memory device 110a. In operation S290, the nonvolatile memory device 110a may adjust the delays of the data input and output lines DQ based on the delays received from the controller 120.

Figure 5:
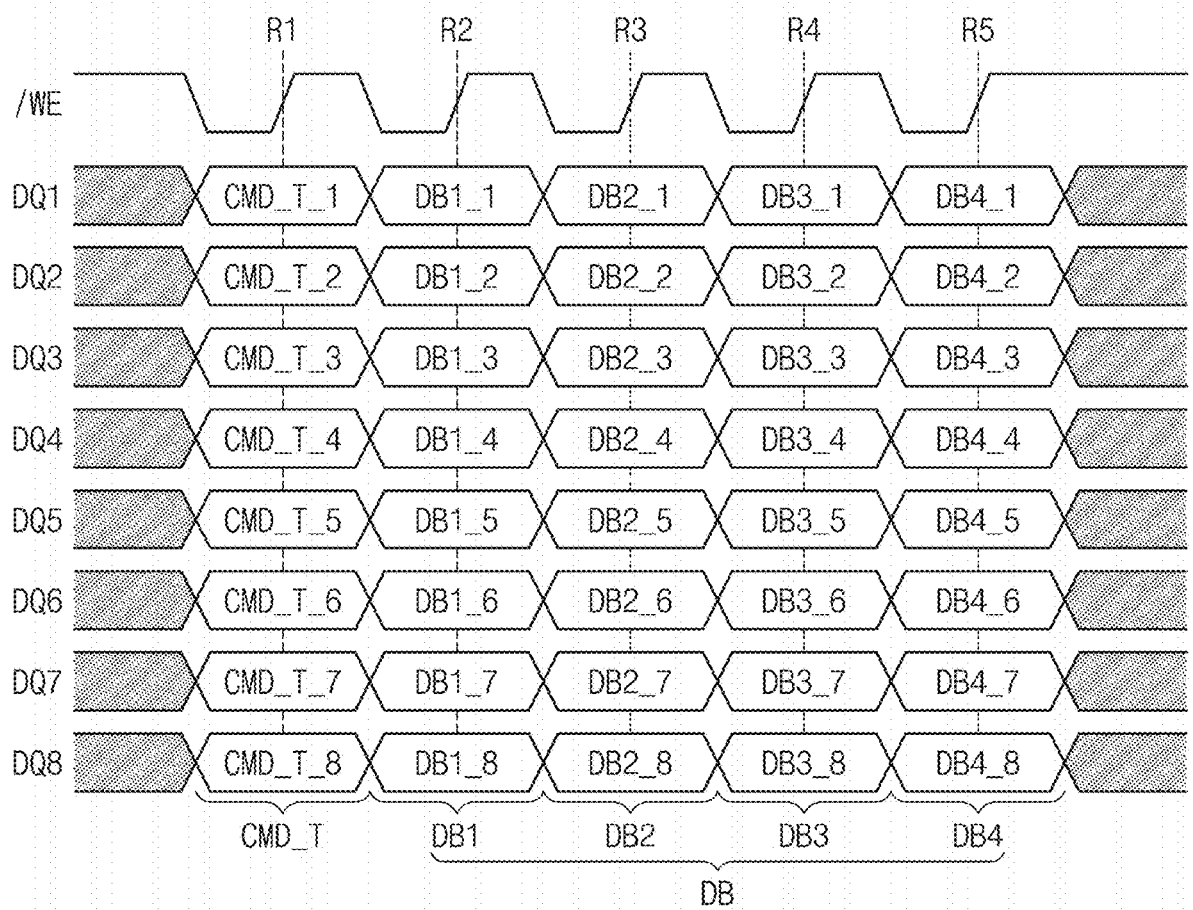
FIG. 5 illustrates an example in which a controller sends a training command and data bits.

FIG. 5 illustrates an example in which the controller 120 sends the training command CMD_T and the data bits DB. Referring to FIGS. 1, 2, and 5, the training command CMD_T and the data bits DB may be sent through the data input and output lines DQ1 to DQ8 in synchronization with the write enable signal /WE. The command latch enable signal CLE may maintain a high level while the training command CMD_T and the data bits DB are transmitted.

The training command CMD_T may be sent in synchronization with a first rising edge R1 of the write enable signal /WE. The training command CMD_T may include command bits CMD_T_1 to CMD_T_8 corresponding to the data input and output lines DQ1 to DQ8, respectively. The training command CMD_T may be sent once in synchronization with a rising edge of the write enable signal /WE or may be sent as much as the given number of times in synchronization with rising edges of the write enable signal /WE.

The data bits DB may include first to fourth data bits DB1 to DB4 that are sent in synchronization with second to fourth rising edges R2 to R4 of the write enable signal /WE, respectively. The first data bits DB1 may include first bits DB1_1 to DB1_8 sent through the data input and output lines DQ1 to DQ8, respectively. Likewise, the second data bits DB2, the third data bits DB3, and the fourth data bits DB4 may include second bits DB2_1 to DB2_8, third bits DB3_1 to DB3_8, and fourth bits DB4_1 to DB4_8, respectively.

The data bits DB are described in FIG. 5 as being sent in synchronization with four rising edges R2 to R5 of the write enable signal/WE, respectively. However, timings when the data bits DB are sent are not limited to four rising edges of the write enable signal/WE. The data bits DB may be sent less or more than four times.

Figure 6:
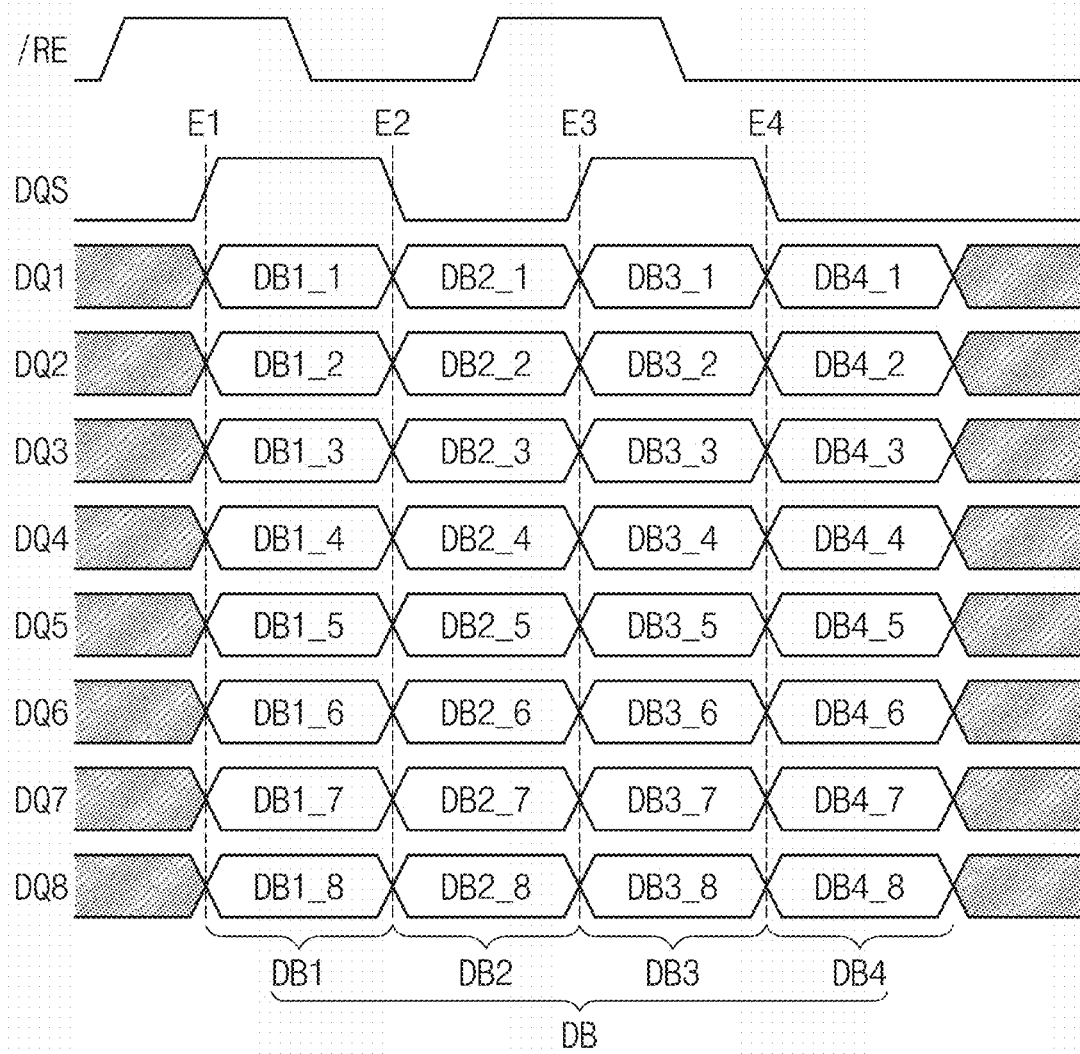
FIG. 6 illustrates an example in which the nonvolatile memory device outputs data bits in response to a training command and data bits of FIG. 5.

FIG. 6 illustrates an example in which the nonvolatile memory device 110a outputs data bits in response to the training command CMD_T and the data bits DB of FIG. 5. Referring to FIGS. 1, 2, and 6, the controller 120 may toggle the read enable signal /RE to a high level and a low level, for example, periodically. In response to the read enable signal /RE, the input and output circuit 114 may toggle the data strobe signal DQS to a high level and a low level periodically.

The input and output circuit 114 may output the data bits DB in synchronization with the data strobe signal DQS. The input and output circuit 114 may output the data bits DB in synchronization with each of rising edges and falling edges of the data strobe signal DQS. The data bits DB may be aligned with the data strobe signal DQS, and thus, the data bits DB and the data strobe signal DQS may be mutually aligned.

Figure 7:
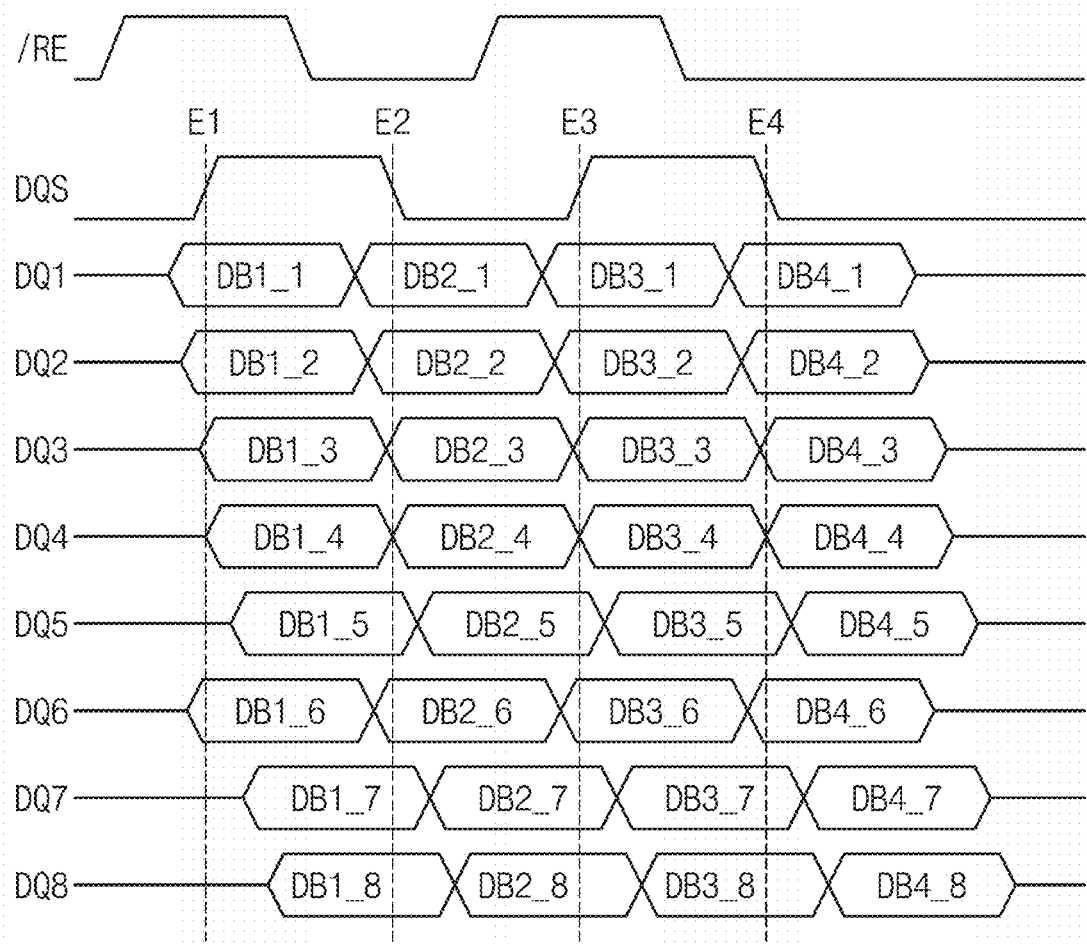
FIG. 7 illustrates an example in which data bits of FIG. 6 are received by a controller.

FIG. 7 illustrates an example in which the data bits DB of FIG. 6 are received by the controller 120. In an example embodiment, timings of the data bits DB received by the controller 120 may be different from timings (refer to FIG. 6) of the data bits DB that the nonvolatile memory device 110a sends, due to various environmental factors (e.g., parasitic resistance, parasitic capacitance, parasitic inductance, temperature, and/or humidity).

Referring to FIGS. 1, 2, and 7, the input and output circuit 114 may generate the data strobe signal DQS from the read enable signal /RE. The input and output circuit 114 may output the data bits DB in synchronization with the data strobe signal DQS.

Timings of bits DB1_1 to DB4_1 sent through a first data input and output line DQ1 may be precede timings of edges of the data strobe signal DQS, respectively. Timings of bits DB1_2 to DB4_2 sent through a second data input and output line DQ2 may be precede timings of the edges of the data strobe signal DQS, respectively. Timings of bits DB1_3 to DB4_3 sent through a third data input and output line DQ3 may be precede timings of the edges of the data strobe signal DQS, respectively.

Timings of bits DB1_4 to DB4_4 sent through a fourth data input and output line DQ4 may be matched with or aligned to timings of the edges of the data strobe signal DQS, respectively. Timings of bits DB1_5 to DB4_5 sent through a fifth data input and output line DQ5 may have delays with respect to timings of the edges of the data strobe signal DQS, respectively. Timings of bits DB1_6 to DB4_6 sent through a sixth data input and output line DQ6 may be precede timings of the edges of the data strobe signal DQS, respectively.

Timings of bits DB1_7 to DB4_7 sent through a seventh data input and output line DQ7 may have delays with respect to timings of the edges of the data strobe signal DQS, respectively. Timings of bits DB1_8 to DB4_8 sent through an eighth data input and output line DQ8 may have delays with respect to timings of the edges of the data strobe signal DQS, respectively. Thus, timings of data bits sent through the data input and output lines DQ1 to DQ8 may not be aligned or matched with each other.

To compensate for differences between timings illustrated in FIGS. 6 and 7, the nonvolatile memory device 110a may adjust timings to send the data bits DB. For example, the nonvolatile memory device 110a may perform training with the controller 120 to detect appropriate transmission timings (or delays), and adjust transmission timings (or delays) based on the detection result.

Figure 8:
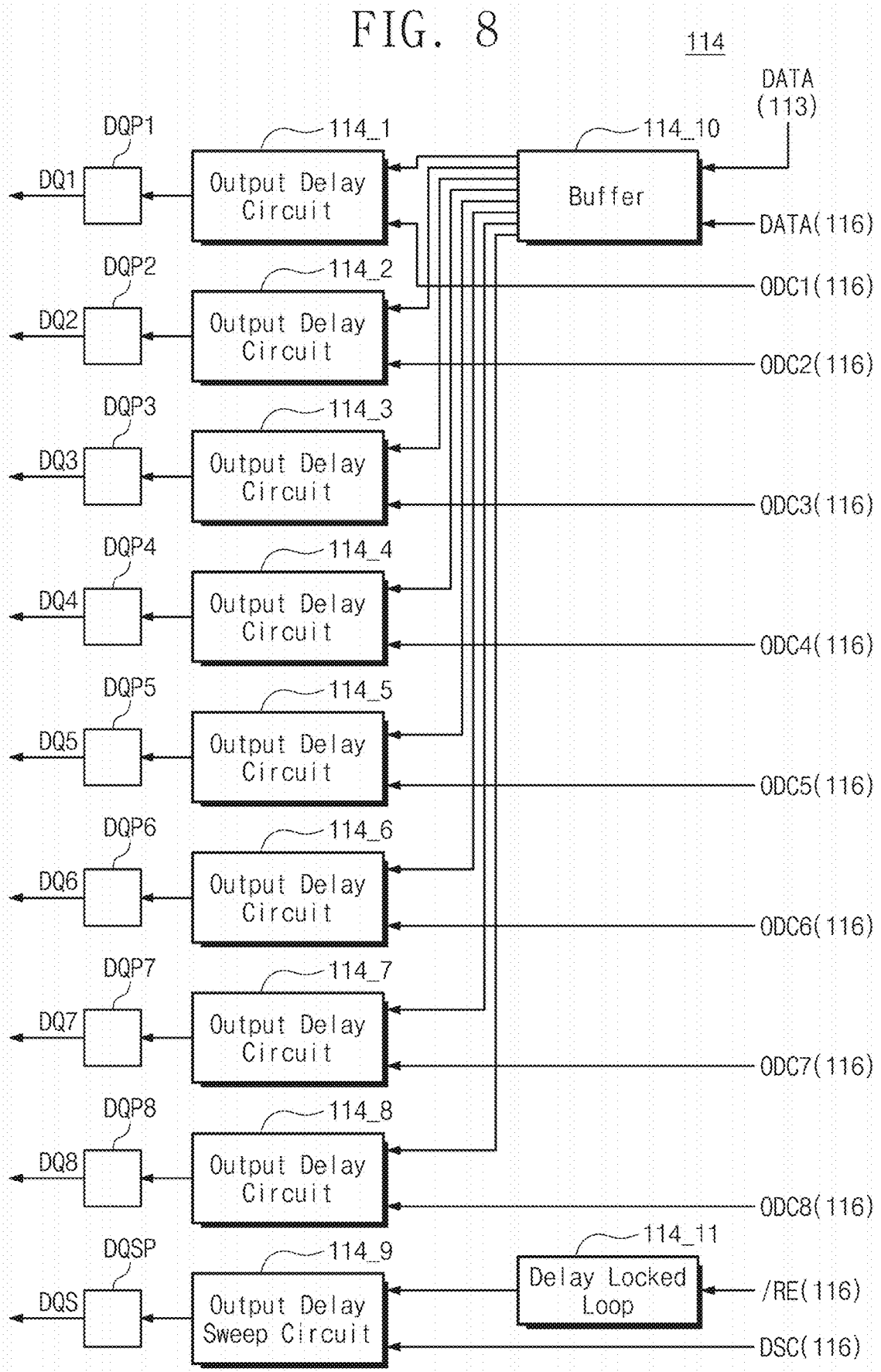
FIG. 8 illustrates an example of an input and output circuit of the nonvolatile memory device.

FIG. 8 illustrates an example of the input and output circuit 114 of the nonvolatile memory device 110a. Referring to FIGS. 2 and 8, the input and output circuit 114 includes data input and output pads DQP1 to DQP8, a data strobe pad DQSP, output delay circuits 114_1 to 114_8, an output delay sweep circuit 114_9, a buffer 114_10, and a delay locked loop 114_11.

The data input and output pads DQP1 to DQP8 may send the data input and output signals DQ1 to DQ8. To briefly convey the technical concepts of the inventive concepts, it is assumed that the data input and output pads DQP1 to DQP8 output the data input and output signals DQ1 to DQ8, respectively, to the controller 120.

The data input and output pads DQP1 to DQP8 also can receive the data input and output signals DQ1 to DQ8, respectively, from the controller 120, and components for processing the received data input and output signals DQ1 to DQ8 can be provided in the input and output circuit 114.

The data strobe pad DQSP may send the data strobe signal DQS. To briefly convey the technical concepts of the inventive concepts, it is assumed that the data strobe pad DQSP outputs the data strobe signal DQS to the controller 120. The data strobe pad DQSP also can receive the data strobe signal DQS from the controller 120, and components for processing the received data strobe signal DQS can be provided in the input and output circuit 114.

The output delay circuits 114_1 to 114_8 are connected to the data input and output pads DQP1 to DQP8, respectively. The output delay circuits 114_1 to 114_8 may send data bits from the buffer 114_10 to the data input and output pads DQP1 to DQP8, respectively. The output delay circuits 114_1 to 114_8 may receive output delay control signals ODC1 to ODC8 from the control logic circuit 116, respectively.

The output delay circuits 114_1 to 114_8 may individually control timings (or delays) to output data bits in response to the output delay control signals ODC1 to ODC8. For example, the first output delay circuit 114_1 may adjust a timing (or delay) to send a data bit from the buffer 114_10 in response to the first output delay control signal ODC1.

The output delay sweep circuit 114_9 may adjust a delay of the data strobe signal DQS output from the delay locked loop 114_11 in response to a delay sweep signal DSC. In some example embodiments, the output delay sweep circuit 114_9 may continuously adjust a delay in a training operation by adjusting delays of the output delay circuits 114_1 to 114_8 once based on a training result.

After the training operation is completed, the output delay circuits 114_1 to 114_8 may maintain the adjusted delay. The output delay sweep circuit 114_9 may have a fixed delay. For example, the fixed delay may be an initial delay or a delay calculated by the training operation.

A maximum delay of the output delay sweep circuit 114_9 may be greater than a maximum one of the delays of the output delay circuits 114_1 to 114_8. For example, the output delay sweep circuit 114_9 may have the maximum delay that is greater than one or more periods of the data strobe signal DQS. Each of the output delay circuits 114_1 to 114_8 may have the maximum delay that is smaller than one period of the data strobe signal DQS.

The buffer 114_10 may send data bits to the output delay circuits 114_1 to 114_8. For example, in the training operation, the data bits DB sent from the control logic circuit 116 may be provided to the output delay circuits 114_1 to 114_8, respectively, after being stored in the buffer 114_10. In the normal operation in which training is not made, data "DATA" sent from the page buffer circuit 113 may be provided to the output delay circuits 114_1 to 114_8 after being stored in the buffer 114_10.

In a read operation or a training operation, the delay locked loop 114_11 may receive the read enable signal /RE from the control logic circuit 116. The delay locked loop 114_11 may delay the read enable signal /RE to generate the data strobe signal DQS. The data strobe signal DQS may be sent to the controller 120 through the output delay sweep circuit 114_9 and the data strobe pad DQSP.

Figure 9:
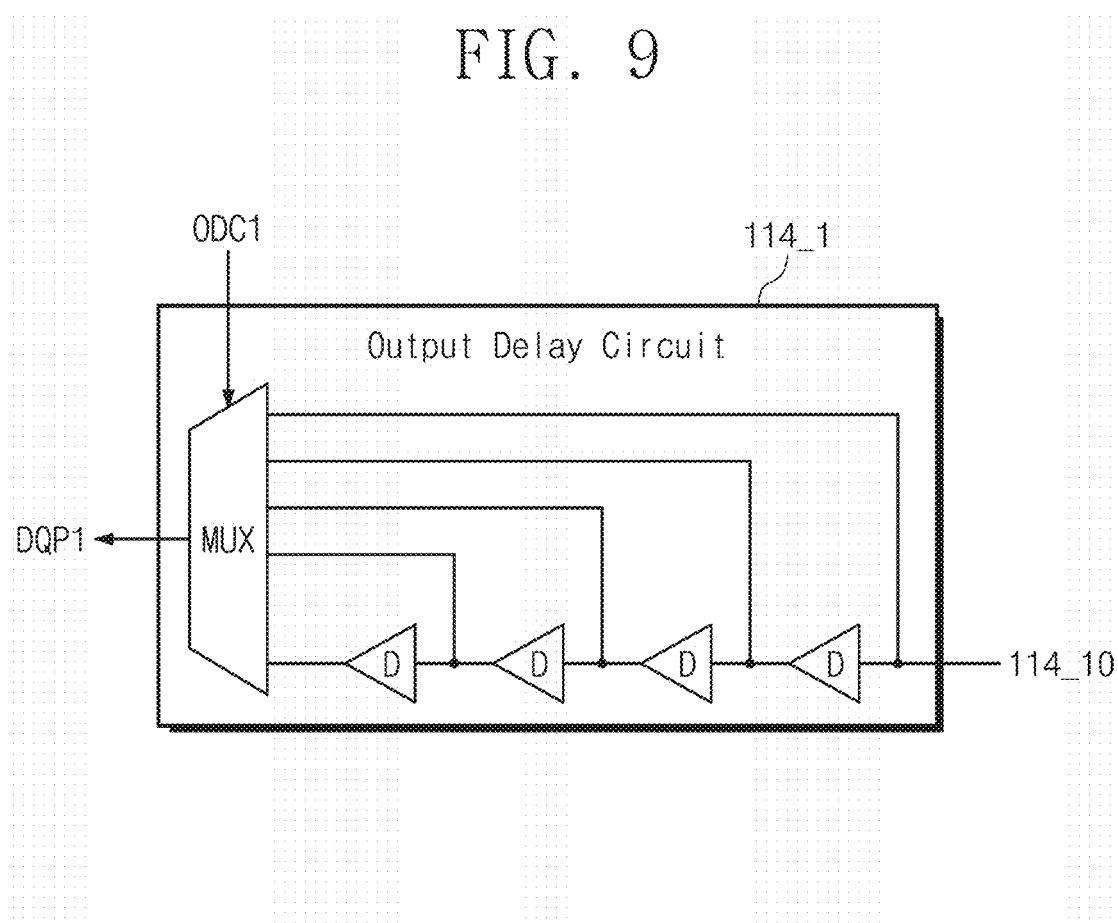
FIG. 9 illustrates an example of an output delay circuit of FIG. 8.

FIG. 9 illustrates an example of the output delay circuit 114_1 of FIG. 8. Referring to FIGS. 1, 2, 8, and 9, the output delay circuit 114_1 includes delay elements "D" and a multiplexer MUX. The delay elements "D" may be sequentially connected to each other. An output of the buffer 114_10 may be connected to the delay elements "D".

The multiplexer MUX may receive a data bit output from the buffer 114_10 and data bits (e.g., data bits having different delays) generated by variously delaying the data bit using the delay elements "D". The multiplexer MUX may send one of the data bit output from the buffer 114_10 and the data bits generated by the delay elements "D" to the data input and output pad DQP1 in response to the output delay control signal ODC1.

That is, the control logic circuit 116 or the output trainer 117 may adjust a timing (e.g., a delay) when the output delay circuit 114_1 outputs a data bit by selecting one from among the data bit output from the buffer 114_10 and data bits generated by variously delaying the data bit in response to the output delay control signal ODC1. Although only the output delay circuit 114_1 is illustrated in FIG. 9, the remaining output delay circuits 114_2 to 114_8 may also have the same structure as illustrated in FIG. 9.

That is, the control logic circuit 116 or the output trainer 117 may adjust timings (e.g., delays) when the output delay circuits 114_1 to 114_8 output data bits by individually adjusting the output delay control signals ODC1 to ODC8.

Figure 10:
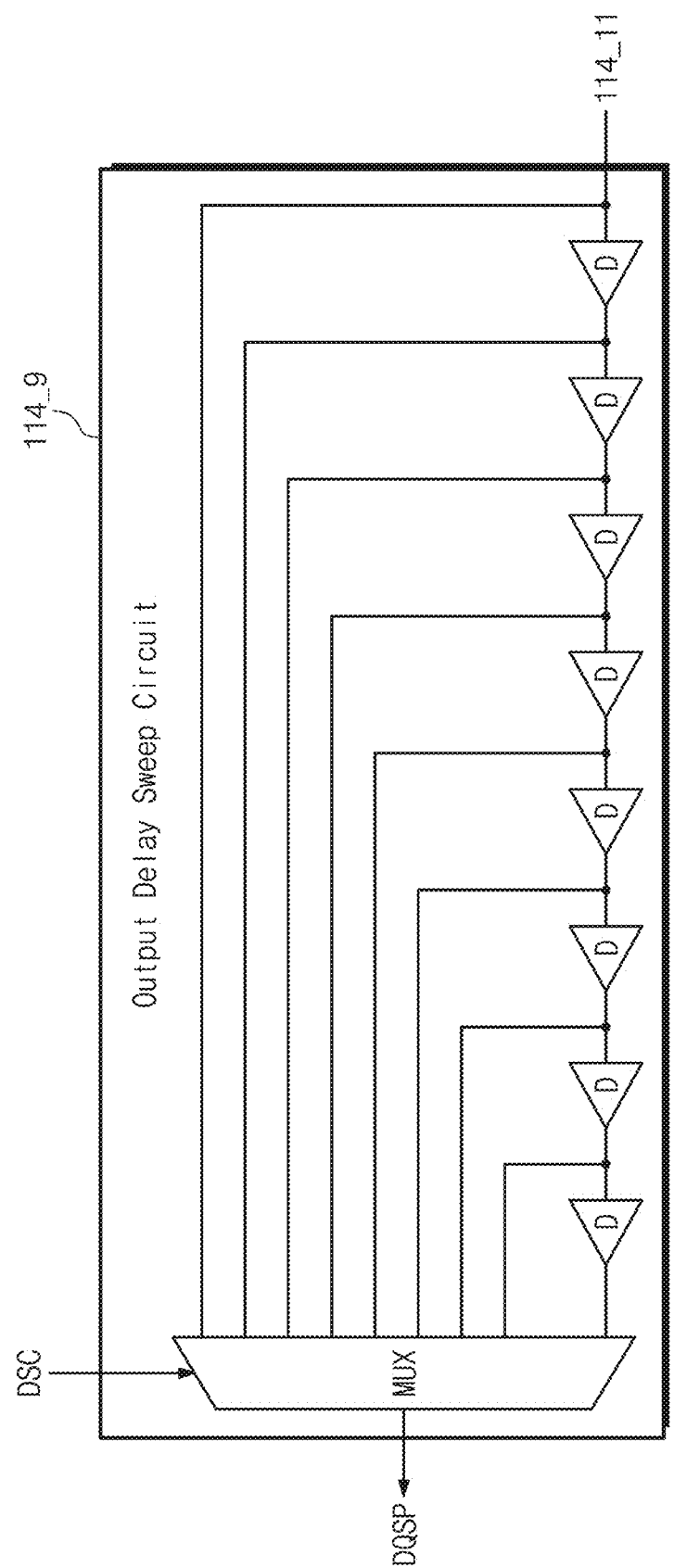
FIG. 10 illustrates an example of an output delay sweep circuit of FIG. 8.

FIG. 10 illustrates an example of the output delay sweep circuit 114_9 of FIG. 8. Referring to FIGS. 1, 2, 8, and 10, the output delay sweep circuit 114_9 includes delay elements "D" and a multiplexer MUX. The delay elements "D" may be sequentially connected to each other. An output of the delay locked loop 114_11 may be connected to the delay elements "D". The multiplexer MUX may select one of outputs of the delay elements "D" and the output of the delay locked loop 114_11 in response to a delay sweep signal DSC.

Compared with the output delay circuit 114_1 of FIG. 9, the number of delay elements "D" of the output delay sweep circuit 114_9 may be more than the number of delay elements "D" of the output delay circuit 114_1. To enable detection of edges of the data bits DB, the output delay sweep circuit 114_9 may vary a delay of the data strobe signal DQS in units of a unit delay, for example, may delay the delay as much as one period of the data strobe signal DQS.

In some example embodiments, the output delay circuits 114_1 to 114_8 may adjust delays as much as delays deduced from the training result. The delays deduced from the training result may be smaller than one period of the data strobe signal DQS, for example, may be smaller than half the period of the data strobe signal DQS. Accordingly, the delay of each of the output delay circuits 114_1 to 114_8 may be smaller than the delay of the output delay sweep circuit 114_9.

The storage device 100 according to an example embodiment of the inventive concepts performs training while sweeping the data strobe signal DQS. Accordingly, the size and complexity of the output delay sweep circuit 114_9 may be greater than the size and complexity of each of the output delay circuits 114_1 to 114_8. If the data bits DB (not the data strobe signal DQS) are swept, the size and complexity of each of the output delay circuits 114_1 to 114_8 may be greater than the size and complexity of the output delay sweep circuit 114_9.

If the data strobe signal DQS is swept according to an example embodiment of the inventive concepts, only the output delay sweep circuit 114_9 associated with the data strobe signal DQS is desired to have a larger size and increased complexity. Accordingly, if the data strobe signal DQS is swept according to an example embodiment of the inventive concepts, the increase in the size and complexity of components of the storage device 100 may be suppressed while increasing reliability of data transmission of the storage device 100 through the training operation.

Figure 11:
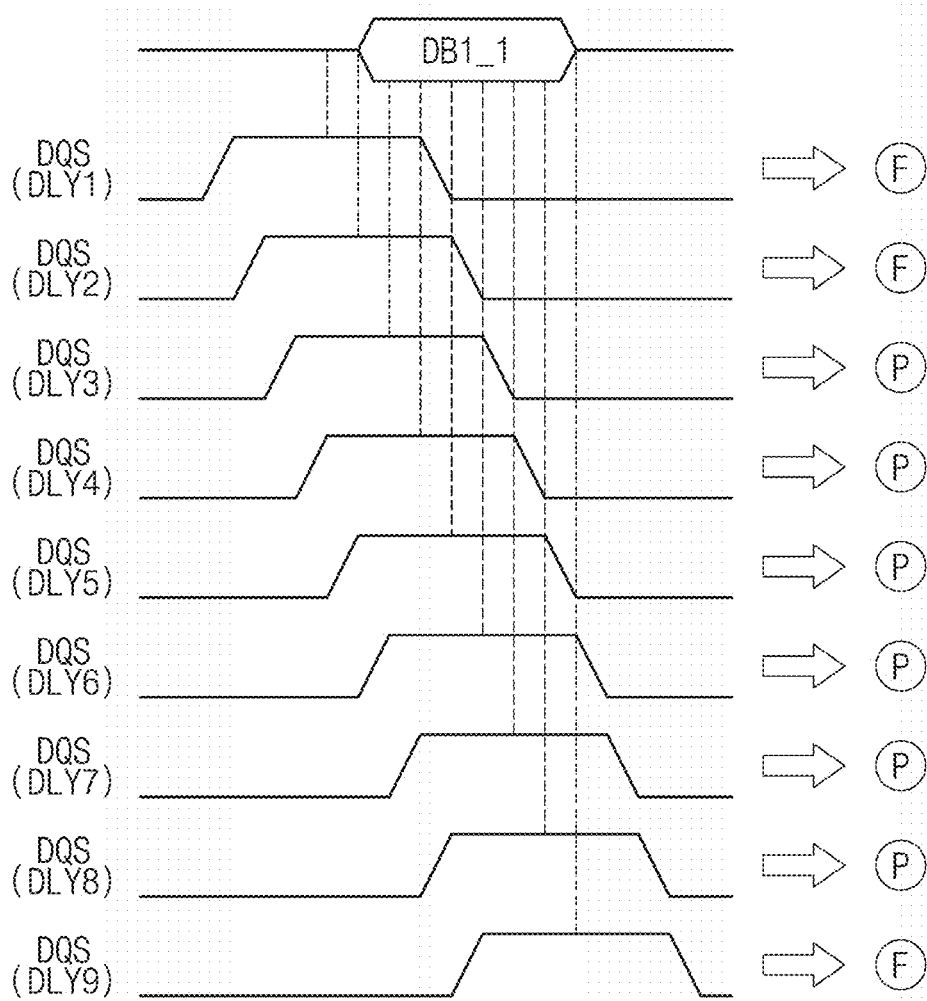
FIG. 11 illustrates an example in which training is performed according to a method of FIG. 4.

FIG. 11 illustrates an example in which training is performed according to the method of FIG. 4. In an example embodiment, an example in which a first bit DB1_1 is received with different delays through a first data input and output line DQ1 from the controller 120 is illustrated in FIG. 11. In FIG. 11, it is assumed that a delay of the data strobe signal DQS increases from a first delay DLY1 to a ninth delay DLY9 toward the bottom.

Referring to FIGS. 1, 2, 4, and 11, when the data strobe signal DQS with the first delay DLY1 is transmitted, the bit DB1_1 received by the controller 120 may not be synchronized with the data strobe signal DQS (e.g., the center of the data strobe signal DQS). Accordingly, an invalid value is received by the controller 120 through the first data input and output line DQ1, and the fail "F" is determined.

When the data strobe signal DQS with the second delay DLY2 is transmitted, the bit DB1_1 received by the controller 120 may not be synchronized with the data strobe signal DQS. Accordingly, the fail "F" is determined. When the data strobe signal DQS with the third delay DLY3 is transmitted, the bit DB1_1 received by the controller 120 may be synchronized with the data strobe signal DQS. Accordingly, the pass "P" is determined.

When the data strobe signal DQS with the delay DLYi (i being one 4 to 8) is transmitted, the bit DB1_1 received by the controller 120 may be synchronized with the data strobe signal DQS. Accordingly, the passes "P" are determined. When the data strobe signal DQS with the ninth delay DLY9 is transmitted, the bit DB1_1 received by the controller 120 may not be synchronized with the data strobe signal DQS. Accordingly, the fail "F" is determined.

As illustrated in FIG. 11, when a first pass is determined with respect to the data strobe signal DQS having the third delay DLY3, a first boundary (e.g., a start boundary) of the bit DB1_1 is detected. The controller 120 may store the second delay DLY2 or the third delay DLY3 in relation to the first boundary of the bit DB1_1.

When a first fail is determined with respect to the data strobe signal DQS having the ninth delay DLY9 after the first pass, a second boundary (e.g., an end boundary) of the bit DB1_1 is detected. The controller 120 may store the eighth delay DLY8 or the ninth delay DLY9 in relation to the second boundary of the bit DB1_1.

The training operation described with reference to FIG. 11 may be equally performed with respect to the remaining data input and output lines DQ2 to DQ8. For example, the training operation may be performed on the data input and output lines DQ1 to DQ8 independently of each other, in parallel, or individually (e.g., simultaneously). The controller 120 may detect edges of the data bits DB through the training operation.

An example in which training is performed while sequentially increasing a delay of the data strobe signal DQS is illustrated in FIG. 11. However, the technical concepts of the inventive concepts may be changed or applied such that training is performed while sequentially decreasing a delay of the data strobe signal DQS.

Figure 12:
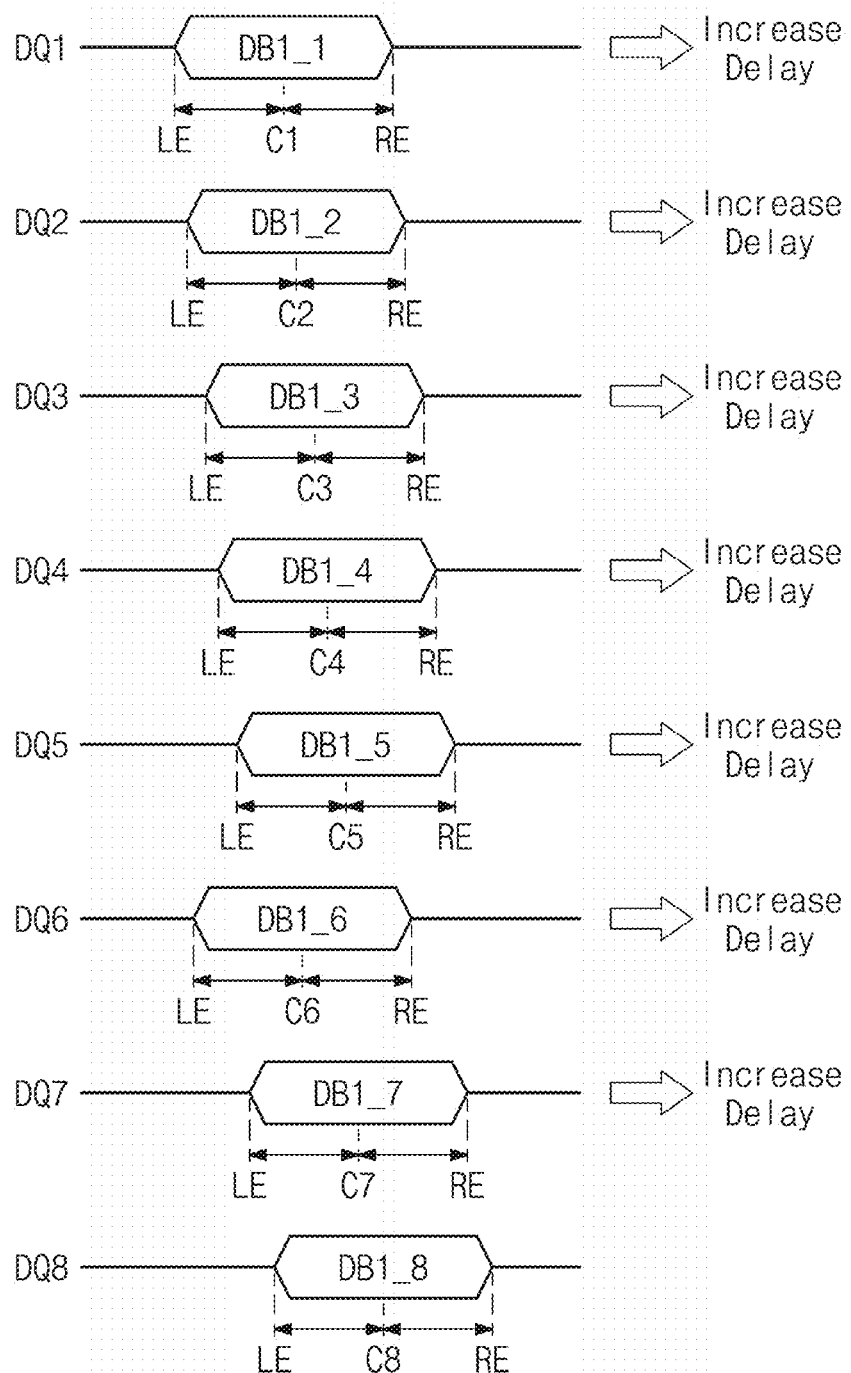
FIG. 12 illustrates an example in which the controller calculates delays based on detected edges.

FIG. 12 illustrates an example in which the controller 120 calculates delays based on detected edges (operation S260 and operation S270). Referring to FIGS. 1, 2, and 12, the controller 120 may detect centers C1 to C8 of the first data bits DB1 based on first edges LE and second edges RE of the first data bits DB1.

The controller 120 may select a center having the greatest delay among the detected centers. For example, the center C8 of the bit DB1_8 received through the eighth data input and output line DQ8 is delayed the greatest. Accordingly, the center C8 (e.g., a delay of the center C8) of the eighth data input and output line DQ8 may be selected.

The controller 120 may calculate delays of the remaining centers C1 to C7 so as to be aligned with the delay of the selected center C8, for example, so as to be the same as the delay of the selected center C8 or so as to be substantially similar to the delay of the selected center C8 within a margin of an error. For example, the delays may be calculated in units of a unit delay of the output delay circuits 114_1 to 114_8.

For example, the centers of the first to seventh data input and output lines DQ1 to DQ7 are prior to the selected center C8. Accordingly, the calculated result may indicate an increase in the delays of the centers C1 to C7. The controller 120 may provide the calculated delays to the nonvolatile memory device 110.

The nonvolatile memory device 110a may adjust the delays of the output delay circuits 114_1 to 114_8 based on the delays from the controller 120, respectively. If the delays of the output delay circuits 114_1 to 114_8 are adjusted, the centers C1 to C8 of the first data bits DB1 are aligned with the selected center C8.

In an example embodiment, as the centers C1 to C8 are aligned instead of the first edges LE or the second edges RE of the first data bits DB1, the margin for identifying data bits sent through the data input and output lines DQ1 to DQ8 at the controller 120 may be further improved. For example, the controller 120 may be configured to identify the first data bits DB1 in synchronization with a rising edge and a falling edge of the data strobe signal DQS, identify respective first edges and respective second edges of the first data bits DB1, identify respective centers between the respective first edges and the respective second edges of the first data bits DB1, calculate respective delays of the first data bits DB1 and send the calculated respective delays to the nonvolatile device 110a to adjust the respective delay of the first data bits DB1.

Figure 13:
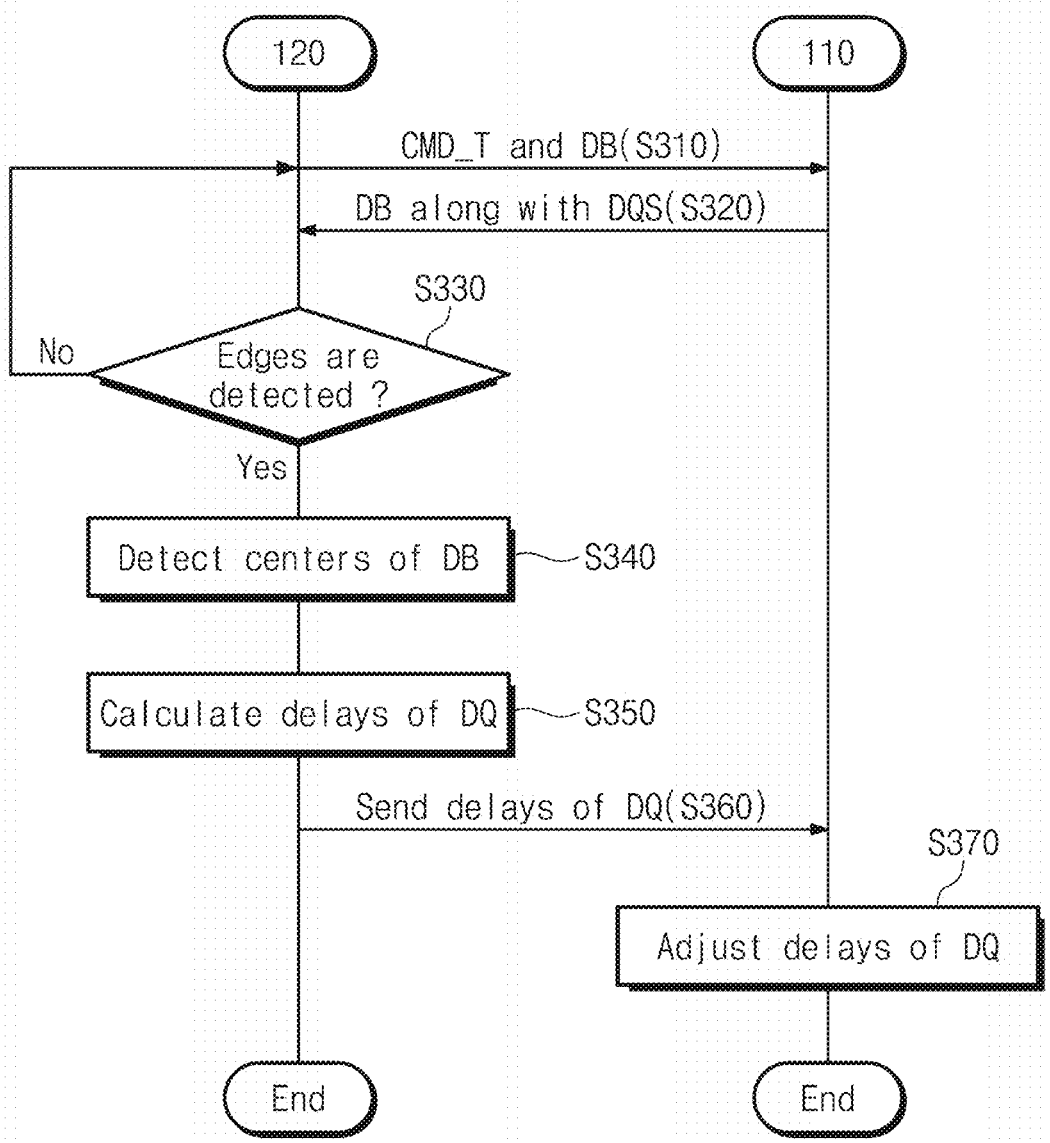
FIG. 13 is a flowchart illustrating another example in which the storage device performs input training.

FIG. 13 is a flowchart illustrating another example in which the storage device 100 perform input training (or write training). Referring to FIGS. 1, 2, and 13, in operation S310, the controller 120 may send the training command CMD_T and the data bits DB to the nonvolatile memory device 110. The data bits DB may be bits, for example, prepared in advance, for training and may be read from the memory 123. The data bits DB may be sent in the form of a command.

In operation S320, the nonvolatile memory device 110a may send the data strobe signal DQS to the controller 120 in response to the training command CMD_T and the data bits DB, and send the data bits DB to the controller 120 through the data input and output lines DQ.

The controller 120 may determine whether edges of the data bits DB are detected. If edges of the data bits DB are not detected, the controller 120 may re-send the training command CMD_T and the data bits DB to the nonvolatile memory device 110a in operation S310.

For example, the controller 120 may send a message for requesting the nonvolatile memory device 110a to adjust a delay of the data strobe signal DQS to the nonvolatile memory device 110a along with the training command CMD_T. As another example, in the training operation, the nonvolatile memory device 110a may be configured to adjust the delay of the data strobe signal DQS whenever the training command CMD_T is received.

If the edges of the data bits DB are detected, in operation S340, the controller 120 may detect the centers of the data bits DB from the edges of the data bits DB. In operation S350, the controller 120 may calculate delays (e.g., output delays or read delays) of the data input and output lines DQ.

In operation S360, the controller 120 may send the calculated delays of the data input and output lines DQ (e.g., transmission timings of the data bits DB) to the nonvolatile memory device 110. In operation S370, the nonvolatile memory device 110a may adjust the delays of the data input and output lines DQ based on the delays received from the controller 120.

Figure 14:
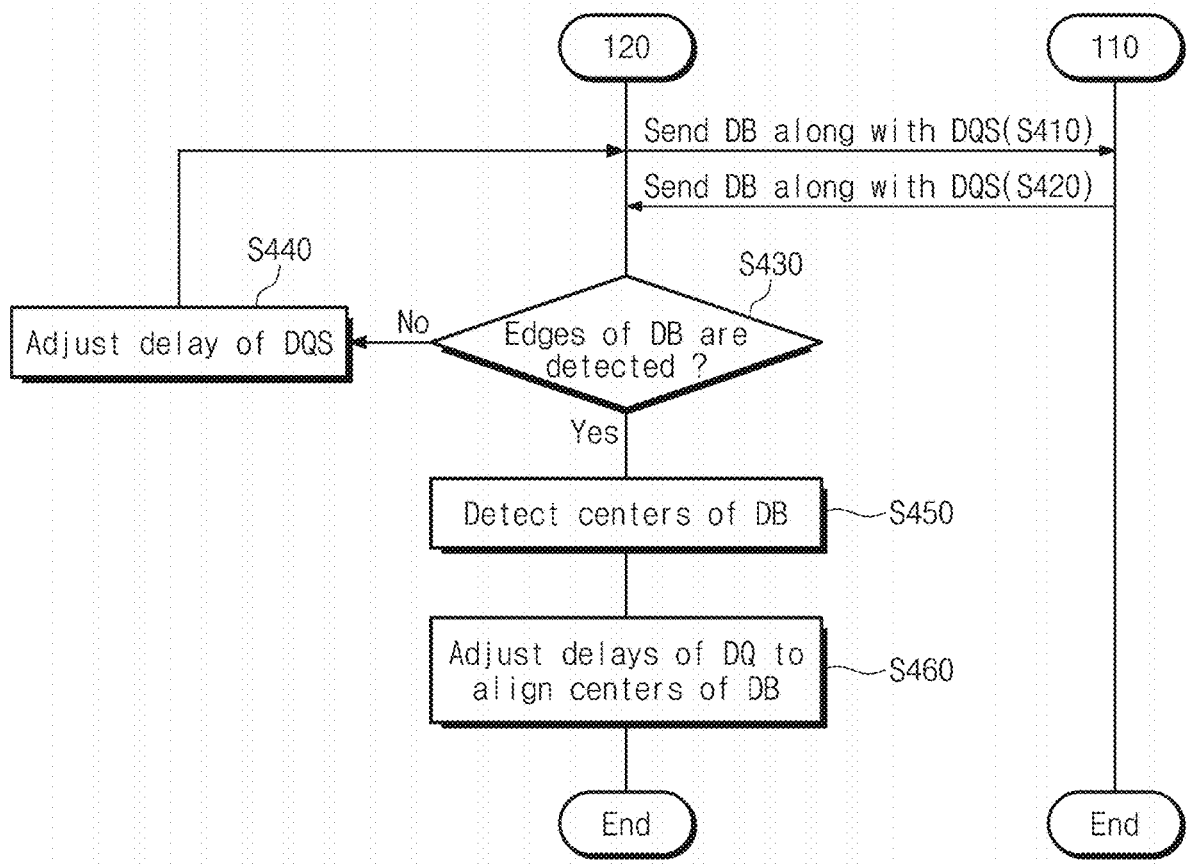
FIG. 14 is a flowchart illustrating an example in which the storage device performs output training.

FIG. 14 is a flowchart illustrating an example in which the storage device 100 perform output training (or read training). Referring to FIGS. 1, 2, and 14, in operation S410, the controller 120 may send the data bits DB to the nonvolatile memory device 110a along with the data strobe signal DQS.

For example, the controller 120 may send the data bits DB to the nonvolatile memory device 110a along with a write command. The nonvolatile memory device 110a may write the data bits DB in the memory cell array 111 or may store the data bits DB in the input and output circuit 114.

In operation S420, the nonvolatile memory device 110a may send data bits DB to the controller 120 along with the data strobe signal DQS. For example, the controller 120 may send a read command to the nonvolatile memory device 110. The nonvolatile memory device 110a may send the data bits DB to the controller 120 in response to the read command.

In operation S430, the controller 120 may determine whether edges of the data bits DB are detected. If the edges of the data bits DB are not detected, in operation S440, the controller 120 may adjust the delay of the data strobe signal DQS. Afterwards, the controller 120 may re-send the data bits DB and the adjusted data strobe signal DQS in operation S410.

If the edges of the data bits DB are detected, in operation S450, the controller 120 may detect the centers of the data bits DB. In operation S460, the controller 120 may adjust delays of the data input and output lines DQ to align the centers of the data bits DB.

Figure 15:
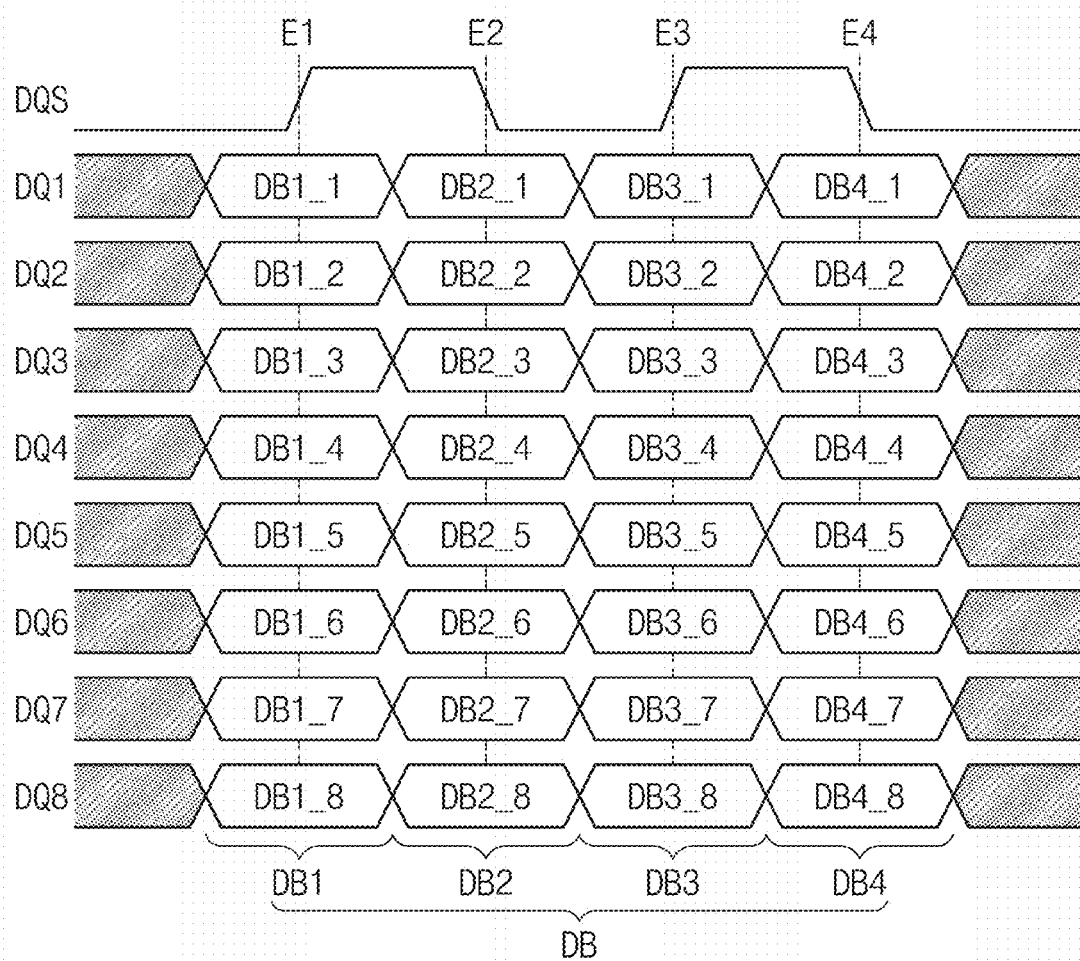
FIG. 15 illustrates an example in which the controller sends data bits to a nonvolatile memory device.

FIG. 15 shows an example in which the controller 120 sends the data bits DB to the nonvolatile memory device 110. Referring to FIGS. 1, 2, and 15, the data bits DB may be sent through the data input and output lines DQ1 to DQ8 in synchronization with the data strobe signal DQS. The data strobe signal DQS may be toggled by the controller 120.

The data bits DB may be sent in synchronization with rising and falling edges E1 to E4 of the data strobe signal DQS. The data bits DB may include the first to fourth data bits DB1 to DB4 that are sent in synchronization with the first to fourth edges E1 to E4 of the data strobe signal DQS.

The first data bits DB1 may include the first bits DB1_1 to DB1_8 sent through the data input and output lines DQ1 to DQ8, respectively. Likewise, the second data bits DB2, the third data bits DB3, and the fourth data bits DB4 may include second bits DB2_1 to DB2_8, third bits DB3_1 to DB3_8, and fourth bits DB4_1 to DB4_8, respectively.

Figure 16:
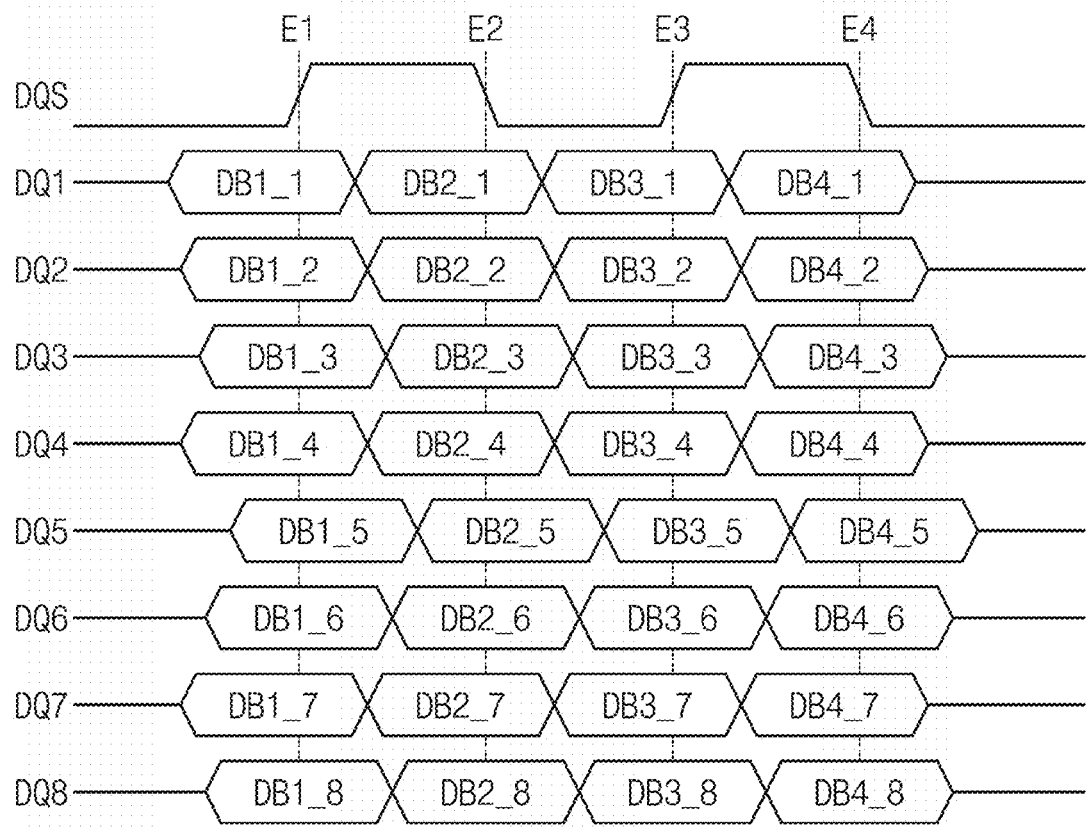
FIG. 16 illustrates an example in which data bits of FIG. 15 are received by the nonvolatile memory device.

FIG. 16 illustrates an example in which the data bits DB of FIG. 15 are received by the nonvolatile memory device 110. In an example embodiment, timings of the data bits DB received by the nonvolatile memory device 110a may be different from timings (refer to FIG. 15) of the data bits DB that the controller 120 sends, due to various environmental factors (e.g., parasitic resistance, parasitic capacitance, parasitic inductance, temperature, and/or humidity).

Referring to FIGS. 1, 2, and 16, the input and output circuit 114 may store (or latch) the data bits DB in synchronization with the first to fourth edges E1 to E4 of the data strobe signal DQS. Timings (e.g., timings of centers) of bits DB1_1 to DB4_1 sent through the first data input and output line DQ1 may precede timings of edges of the data strobe signal DQS, respectively.

Timings of bits DB1_2 to DB4_2 sent through the second data input and output line DQ2 may precede timings of the edges of the data strobe signal DQS, respectively. Timings of bits DB1_3 to DB4_3 sent through the third data input and output line DQ3 may be aligned or matched with respect to timings of the edges of the data strobe signal DQS, respectively.

Timings of bits DB1_4 to DB4_4 sent through the fourth data input and output line DQ4 may precede timings of the edges of the data strobe signal DQS, respectively. Timings of bits DB1_5 to DB4_5 sent through the fifth data input and output line DQ5 may have delays with respect to timings of the edges of the data strobe signal DQS, respectively. Timings of bits DB1_6 to DB4_6 sent through the sixth data input and output line DQ6 may be aligned or matched with respect to timings of the edges of the data strobe signal DQS, respectively.

Timings of bits DB1_7 to DB4_7 sent through the seventh data input and output line DQ7 may precede timings of the edges of the data strobe signal DQS, respectively. Timings of bits DB1_8 to DB4_8 sent through the eighth data input and output line DQ8 may be aligned or matched with respect to timings of the edges of the data strobe signal DQS, respectively. Timings of data bits sent through the data input and output lines DQ1 to DQ8 may not be matched with each other, respectively.

To compensate for differences between timings illustrated in FIGS. 15 and 16, the controller 120 may adjust timings to send the data bits DB. For example, the controller 120 may perform training with the nonvolatile memory device 110a to detect appropriate transmission timings (or delays) and adjust transmission timings (or delays) based on the detection result.

Figure 17:
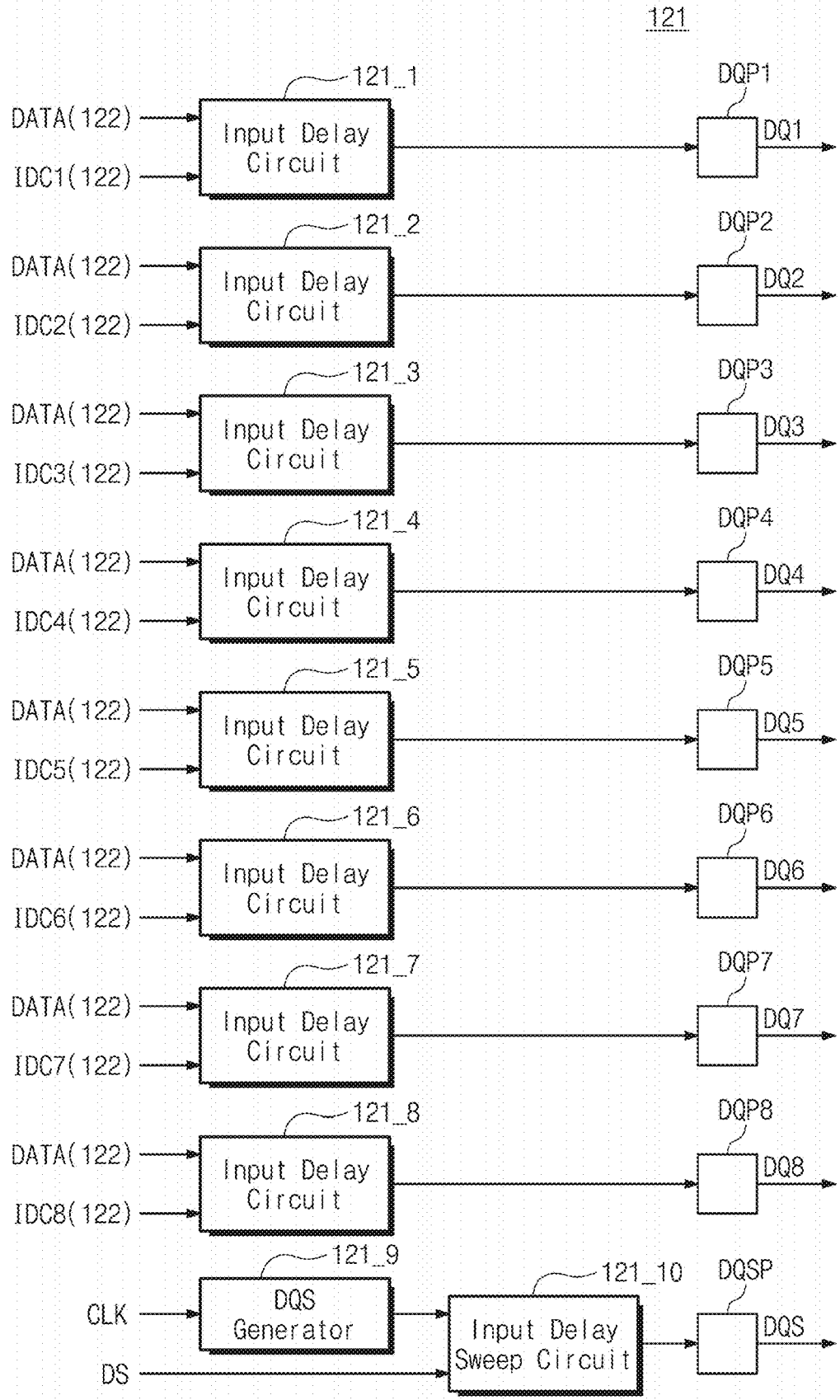
FIG. 17 illustrates an example of a memory interface of the controller.

FIG. 17 illustrates an example of the memory interface 121 of the controller 120. Referring to FIGS. 1 and 17, the memory interface 121 includes data input and output pads DQP1 to DQP8, a data strobe pad DQSP, input delay circuits 121_1 to 121_8, a data strobe signal (DQS) generator 121_9, and an input delay sweep circuit 121_10.

The data input and output pads DQP1 to DQP8 may send the data input and output signals DQ1 to DQ8. To briefly convey the technical concepts of the inventive concepts, the data input and output pads DQP1 to DQP8 is assumed to input the data input and output signals DQ1 to DQ8, respectively, to the nonvolatile memory device 110.

The data input and output pads DQP1 to DQP8 also may receive the data input and output signals DQ1 to DQ8, respectively, from the nonvolatile memory device 110a and components for processing the received data input and output signals DQ1 to DQ8 may be provided in the memory interface 121.

The data strobe pad DQSP may send the data strobe signal DQS. To briefly convey the technical concepts of the inventive concepts, the data strobe pad DQSP may be assumed to input the data strobe signal DQS to the nonvolatile memory device 110.

The data strobe pad DQSP also may receive the data strobe signal DQS from the nonvolatile memory device 110a, and components for processing the received data strobe signal DQS may be provided in the memory interface 121.

The input delay circuits 121_1 to 121_8 are connected to the data input and output pads DQP1 to DQP8, respectively. The input delay circuits 121_1 to 121_8 may send data bits provided through the input and output trainer 122 from the memory 123 to the data input and output pads DQP1 to DQP8, respectively. The input delay circuits 121_1 to 121_8 may receive input delay control signals IDC1 to IDC8 from the input and output trainer 122, respectively.

The input delay circuits 121_1 to 121_8 may individually control timings (or delays) to input data bits in response to the input delay control signals IDC1 to IDC8. For example, the first input delay circuit 121_1 may adjust a timing (delay) to send a data bit from the input and output trainer 122 in response to the first input delay control signal IDC1. In an example embodiment, the input delay circuits 121_1 to 121_8 may have the same structure as illustrated in FIG. 9.

The data strobe signal generator 121_9 may receive a clock CLK. The clock CLK may be generated within the controller 120 or may be supplied from an external device to the controller 120. The data strobe signal generator 121_9 may generate the data strobe signal DQS by using the clock CLK.

The input delay sweep circuit 121_10 may adjust a delay of the data strobe signal DQS output from the data strobe signal generator 121_9 in response to a delay sweep signal DS. In some example embodiments, the input delay sweep circuit 121_10 may continuously adjust a delay in a training operation, by adjusting delays of the input delay circuits 121_1 to 121_8 once based on a training result.

After the training operation is completed, the input delay circuits 121_1 to 121_8 may maintain the adjusted delay. The input delay sweep circuit 121_10 may have a fixed delay. For example, the fixed delay may be an initial delay or a delay calculated by the training operation.

A maximum delay of the input delay sweep circuit 121_10 may be greater than a maximum one of the delays of the input delay circuits 121_1 to 121_8. For example, the input delay sweep circuit 121_10 may have the maximum delay that is greater than one or more periods of the data strobe signal DQS. Each of the input delay circuits 121_1 to 121_8 may have the maximum delay that is smaller than one period of the data strobe signal DQS.

For example, the input delay circuits 121_1 to 121_8 may have the same structure as illustrated in FIG. 9. The input delay sweep circuit 121_10 may have the same structure as described with reference to FIG. 10. The data strobe signal DQS, the delay of which is adjusted by the input delay sweep circuit 121_10, may be sent to the nonvolatile memory device 110a through the data strobe pad DQSP.

In an example embodiment, components that generate various signals (e.g., the read enable signal /RE and/or the write enable signal /WE) by using the clock CLK may be provided to the memory interface 121. However, such components are omitted in this disclosure so as not to confuse the technical concepts of the inventive concepts.

Figure 18:
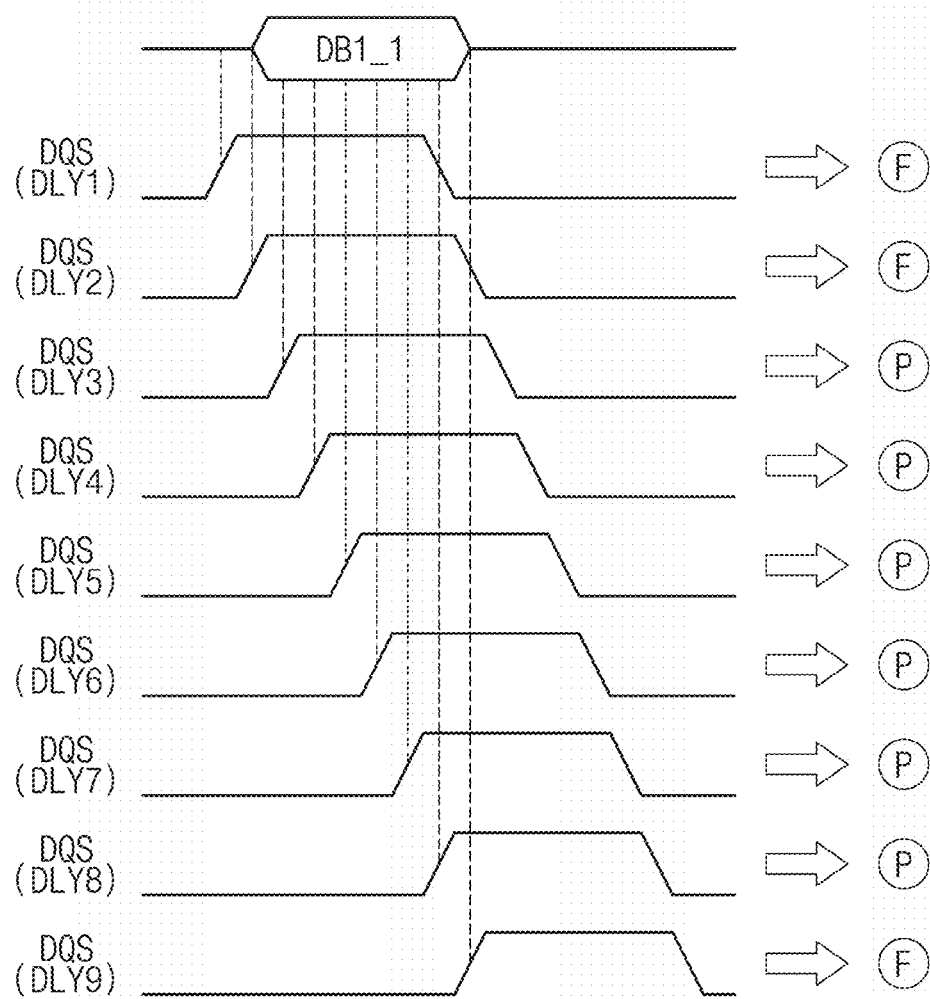
FIG. 18 illustrates an example in which training is performed according to a method of FIG. 14.

FIG. 18 illustrates an example in which training is performed according to the method of FIG. 14. In FIG. 18, a delay of the data strobe signal DQS is assumed to increase from the first delay DLY1 to the ninth delay DLY9 toward the bottom. Referring to FIGS. 1, 2, and 18, the controller 120 may send the data bit DB1_1 through the first data input and output line DQ1 along with the data strobe signal DQS.

When the data strobe signal DQS with the first delay DLY1 has a rising edge in the nonvolatile memory device 110, the bit DB1_1 has an invalid value (or information). Accordingly, the nonvolatile memory device 110a may write or store an invalid value. When the controller 120 requests a read operation, the nonvolatile memory device 110a may send the invalid value to the controller 120. That is, the controller 120 may determine the bit DB1_1 associated with the data strobe signal DQS having the first delay DLY1 as the fail "F".

When the data strobe signal DQS with the second delay DLY2 has a rising edge in the nonvolatile memory device 110, the bit DB1_1 has an invalid value. Accordingly, the controller 120 may determine the bit DB1_1 associated with the data strobe signal DQS having the second delay DLY2 as the fail "F".

When the data strobe signal DQS with the second delay DLY3 has a rising edge in the nonvolatile memory device 110, the bit DB1_1 has a valid value. Accordingly, the controller 120 may determine the bit DB1_1 associated with the data strobe signal DQS having the third delay DLY3 as the pass "P".

When the data strobe signal DQS with the delay DLYi (i being one of 4 to 8) has a rising edge in the nonvolatile memory device 110, the bit DB1_1 has a valid value. Accordingly, the controller 120 may determine the bit DB1_1 associated with the data strobe signal DQS having the delay DLYi has the pass "P".

When the data strobe signal DQS with the ninth delay DLY9 has a rising edge in the nonvolatile memory device 110, the bit DB1_1 has an invalid value. Accordingly, the controller 120 may determine the bit DB1_1 associated with the data strobe signal DQS having the ninth delay DLY9 as the fail "F".

As illustrated in FIG. 18, when a first pass is determined with respect to the data strobe signal DQS having the third delay DLY3, a first boundary (e.g., a start boundary) of the bit DB1_1 is detected. The controller 120 may store the second delay DLY2 or the third delay DLY3 in relation to the first boundary of the bit DB1_1.

When a first fail is determined with respect to the data strobe signal DQS having the ninth delay DLY9 after the first pass, a second boundary (e.g., an end boundary) of the bit DB1_1 is detected. The controller 120 may store the second delay DLY8 or the third delay DLY9 in relation to the second boundary of the bit DB1_1.

The training operation described with reference to FIG. 18 may be equally performed with respect to each of the remaining data input and output lines DQ2 to DQ8. For example, the training operation may be performed on the data input and output lines DQ1 to DQ8 independently of each other, in parallel, or individually (e.g., simultaneously). The controller 120 may detect timings of the data bits DB through the training operation.

An example in which training is performed while sequentially increasing a delay of the data strobe signal DQS has been described with reference to FIG. 18. However, the technical concepts of the inventive concepts may be changed or applied such that training is performed while sequentially decreasing a delay of the data strobe signal DQS.

If the edges of the data bits DB are detected, as described with reference to FIG. 12, the controller 120 may detect the centers of the data bits DB. The controller 120 may calculate the delays with respect to the data input and output lines DQ1 to DQ8, respectively, such that the centers of the data bits DB are aligned to, for example, the most delayed center among the centers of the data bits DB. Afterwards, the controller 120 may adjust the delays of the input delay circuits 121_1 to 121_8 based on the calculated delays, respectively.

Figure 19:
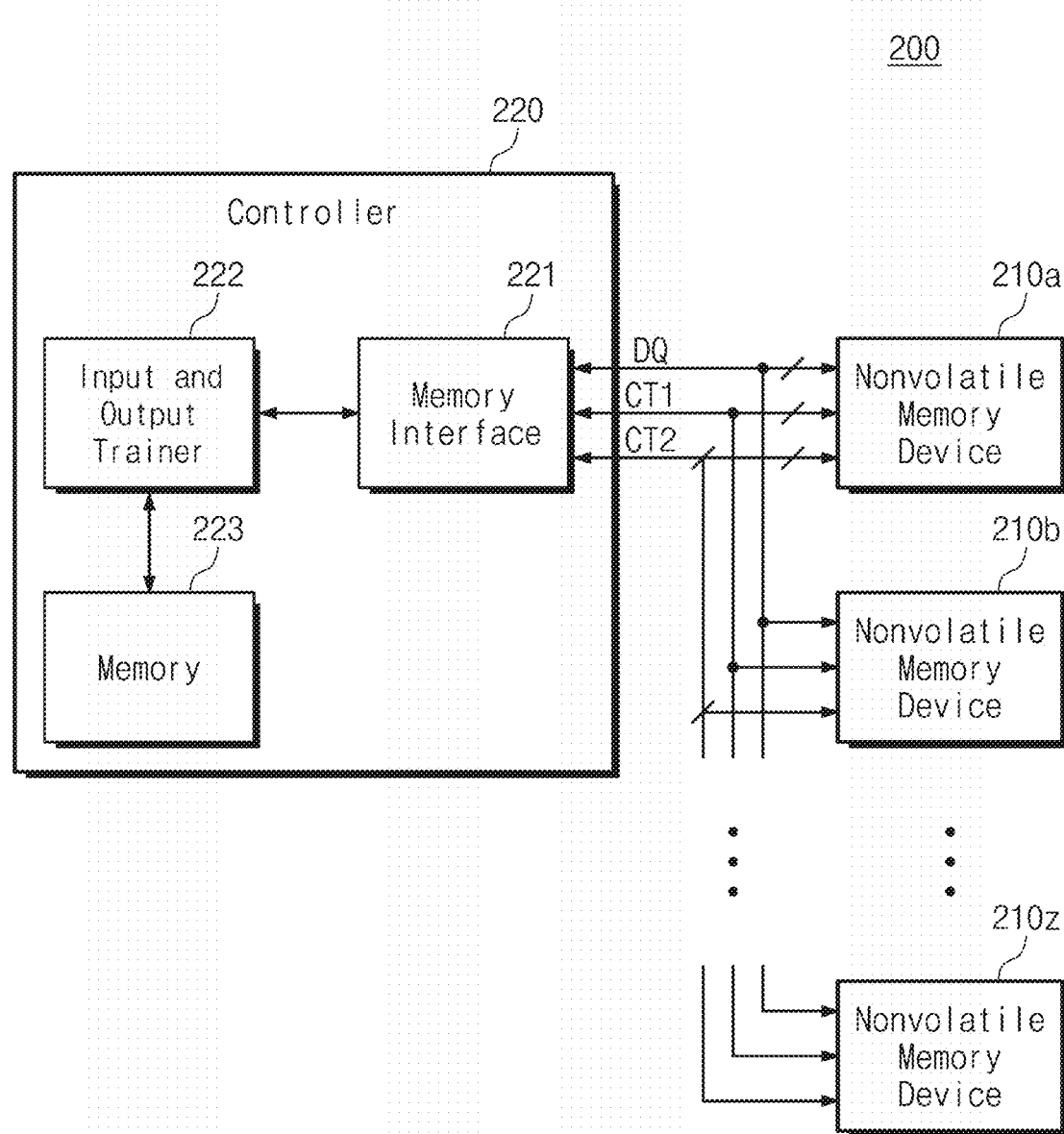
FIG. 19 is a block diagram illustrating the storage device according to an application of the inventive concepts.

FIG. 19 is a block diagram illustrating a storage device 200 according to an example embodiment of the inventive concepts. Referring to FIG. 19, the storage device 200 may include a plurality of nonvolatile memory devices 210a, 210b, ..., and 210z and a controller 220. The nonvolatile memory devices 210a, 201b, ..., and 210z may include homogeneous memories or heterogeneous memories. The nonvolatile memory devices 210a, 201b, ..., and 210z may communicate with the controller 220 through the data input and output lines DQ, the first control lines CT1, and the second control lines CT2.

The data input and output lines DQ may be connected in common to the nonvolatile memory devices 210a, 201b, ..., and 210z. For example, a signal (e.g., a data bit) that is received from the controller 220 may be provided in common to the nonvolatile memory devices 210a, 201b, ..., and 210z through one of the data input and output lines DQ.

The first control lines CT1 may be connected in common to the nonvolatile memory devices 210a, 201b, ..., and 210z. For example, a signal (e.g., a control signal) that is sent from the controller 220 may be provided in common to the nonvolatile memory devices 210a, 210b, ..., and 210z through one of the first control lines CT1.

The second control lines CT2 may be individually connected to the nonvolatile memory devices 210a, 201b, ..., and 210z. For example, the controller 220 and the nonvolatile memory device 210a may be connected through at least one of the second control lines CT2. For example, the controller 220 and the nonvolatile memory device 210b may be connected through at least another of the second control lines CT2.

Among signals sent through the second control lines CT2, the chip enable signal /CE may be used for the controller 220 to select a nonvolatile memory device targeted for an access among the nonvolatile memory devices 210a, 210b, ..., and 210z. The ready/busy signal R/B may be used for each of the nonvolatile memory devices 210a, 210b, ..., and 210z to indicate a state, for example, a ready state or a busy state.

The nonvolatile memory devices 210a, 210b, ..., and 210z may receive the chip enable signals /CE through dedicated control signals (e.g., ones of the second control lines CT2), respectively. The nonvolatile memory devices 210a, 210b, ..., and 210z may send the ready/busy signals R/B through dedicated control signals (e.g., the others of the second control lines CT2), respectively.

The controller 220 may include a memory interface 221, an input and output trainer 222, and a memory 223. The controller 220 may perform training operation described with reference to FIGS. 2 to 18 with regard to the nonvolatile memory devices 210a, 210b, ..., and 210z. For example, the controller 220 may sequentially perform the training operation on the nonvolatile memory devices 210a, 210b, ..., and 210z sharing the data input and output lines DQ.

For example, the controller 220 may perform the training operation with the nonvolatile memory device 210a. After the training operation with the nonvolatile memory device 210a is completed, the controller 220 may perform the training operation with the nonvolatile memory device 210b. The training operation may include at least one of an output (or read) training operation or an input (or write) training operation.

Figure 20:
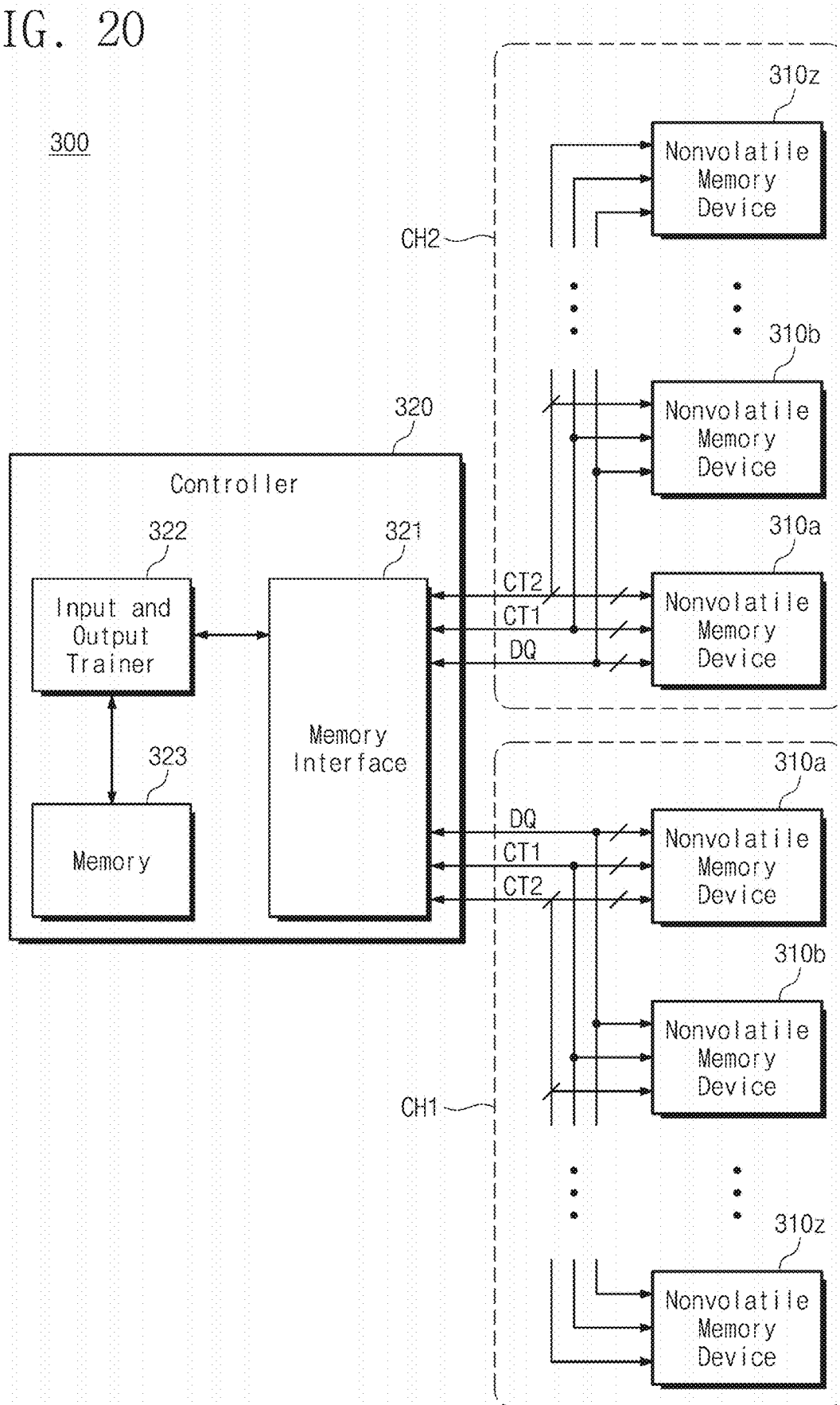
FIG. 20 is a block diagram illustrating a storage device according to an application of the inventive concepts.

FIG. 20 is a block diagram illustrating a storage device 300 according to an application of the inventive concepts. Referring to FIG. 20, the storage device 300 may include nonvolatile memory devices 310a, 310b, ..., and 310z of a first channel CH1, nonvolatile memory devices 310a, 310b, ..., and 310z of a second channel CH2, and a controller 320. The controller 320 may include a memory interface 321, an input and output trainer 322, and a memory 323.

The memory interface 321 may control the first channel CH1 and the second channel CH2 independently of each other, individually, or in parallel. The memory interface 321 may simultaneously perform training in the second channel CH2 while performing training in the first channel CH1.

According to the inventive concepts, a storage device performs a training operation on a data strobe signal and data bits while delaying the data strobe signal. A delay element having a relatively large delay is used with respect to the data strobe signal, and delay elements having a relatively small delay are used with respect to the data bits. Accordingly, storage devices and/or operating methods may be able to reduce the size and complexity of the delay elements and/or reduce overhead due to the training operation.

While the inventive concepts have been described with reference to some example embodiments thereof, it will be apparent to those of ordinary skill in the art that various changes and modifications may be made thereto without departing from the spirit and scope of the inventive concepts as set forth in the following claims.

What is claimed is:

1. A storage device comprising:
a nonvolatile memory device including memory blocks; and
a controller connected with the nonvolatile memory device through data input and output lines and a data strobe line,
wherein the nonvolatile memory device and the controller are configured to perform a first training to align a data strobe signal of the data strobe line and data bits of the data input and output lines,
wherein the data strobe signal includes a first data strobe signal output to the data strobe line from the controller and a second data strobe signal output to the data input and output line from the nonvolatile memory device,
wherein the data bits includes a first data bits output to the data strobe line from the controller and a second data bits output to the data input and output line from the nonvolatile memory device,
wherein the first training comprises,
inputting, by the controller, data through the first data bits through the data input and output lines to the nonvolatile memory device in sync with the first data strobe signal,
reading, by the controller, the second data bits corresponding to the first data bits through the data input and output lines from the nonvolatile memory device in sync with the second data strobe signal, and
adjusting, by the controller, the first data strobe signal based on a result of the reading,
wherein the nonvolatile memory device is further configured to receive a read enable signal from the controller and output the second data strobe signal during the first training, the second data strobe signal being delayed from the read enable signal, and
wherein the read enable signal toggles with a certain period during a first time interval and stop toggling with the certain period during a second time interval.

2. The storage device of claim 1, wherein the second data strobe signal has at least a partly same waveform with the read enable signal.

3. The storage device of claim 1, wherein the controller adjusts a delay of the first data strobe signal when adjusting the first data strobe signal.

4. The storage device of claim 3, wherein the controller maintains delays of the first data bits while adjusting the delay of the first data strobe signal.

5. The storage device of claim 1, wherein the first training aligns centers of the first data bits to an edge of the first data strobe signal.

6. The storage device of claim 1, wherein the nonvolatile memory device and the controller are further configured to perform a second training to align the data strobe signal and the data bits before the first training.

7. The storage device of claim 6, wherein
the data bits further includes third data bits output to the data input and output line from the nonvolatile memory device, and
the second training comprises,
sending, by the controller, a command to the nonvolatile memory device,
receiving, by the controller, the third data bits in response to the command in sync with the second data strobe signal, and
aligning the third data bits and the second data strobe signal based on the received third data.

8. The storage device of claim 7, wherein the second training further comprises:
sending, by the controller, information of the third data bits along with the command to the nonvolatile memory device.

9. A storage device comprising:
a nonvolatile memory device including memory blocks; and
a controller connected with the nonvolatile memory device through data input and output lines and a data strobe line,
wherein the nonvolatile memory device and the controller are configured to perform a first training to align a data strobe signal of the data strobe line and data bits of the data input and output lines,
wherein the data strobe signal includes a first data strobe signal output to the data strobe line from the controller and a second data strobe signal output to the data input and output line from the nonvolatile memory device,
wherein the data bits includes a first data bits output to the data strobe line from the controller and a second data bits output to the data input and output line from the nonvolatile memory device,
wherein the first training comprises,
inputting, by the controller, data through the first data bits through the data input and output lines to the nonvolatile memory device in sync with first data strobe signal,
reading, by the controller, the second data bits corresponding to the first data bits through the data input and output lines from the nonvolatile memory device in sync with second data strobe, and
adjusting, by the controller, delays of the first data bits based on a result of the reading,
wherein the nonvolatile memory device is further configured to receive a read enable signal from the controller and output the second data strobe signal during the first training, the second data strobe signal being delayed from the read enable signal, and
wherein the read enable signal toggles with a certain period during a first time interval and stop toggling with the certain period during a second time interval.

10. The storage device of claim 9, wherein controller maintains a delay of the first data strobe signal while adjusting the delays of the first data bits.

11. The storage device of claim 9, wherein the controller is further configured repeat the inputting and the reading to adjust the delays.

12. The storage device of claim 11, wherein the controller is further configured to adjust a delay of the first data strobe signal after the reading and before the inputting.

13. The storage device of claim 11, wherein the controller maintains the delays of the first data bits while repeating the inputting and the reading.

14. The storage device of claim 9, wherein the first training is performed after power-on.

15. The storage device of claim 9, wherein the nonvolatile memory device and the controller are further configured to perform a second training to align the data strobe signal and the data bits before the first training.

16. An operating method of a storage device comprising a nonvolatile memory device and a controller configured to control the nonvolatile memory device, the method comprising:

after power on, performing a first training and a second training sequentially to align data bits and a data strobe signal between the controller and the nonvolatile memory device, wherein the first training comprises, sending, by the controller, a first command to the nonvolatile memory device, receiving, by the controller, first data bits in response to the first command in sync with a first data strobe signal, and aligning the first data bits and the first data strobe signal based on a received third data, wherein the second training comprises, sending, by the controller, a second command and second data bits in sync with a second data strobe signal to the nonvolatile memory device, receiving, by the controller, a third command and third data bits in response to the third command in sync with the first data strobe signal, and aligning the second data bits and the second data strobe signal based on the received third data, wherein the nonvolatile memory device is further configured to receive a read enable signal from the controller and output the first data strobe signal during the first training and the second training, the first data strobe signal being delayed from the read enable signal, and wherein the read enable signal toggles with a certain period during a first time interval and stop toggling with the certain period during a second time interval.

17. The operating method of claim 16, wherein the aligning the second data bits and the second data strobe signal comprises:

adjusting delays of the first data bits.

18. The operating method of claim 17, wherein the aligning the first data bits and the first data strobe signal further comprises:

adjusting delay of the first data strobe signal to detect the delays of the first data bits.

19. The operating method of claim 16, further comprising:

sending, by the controller, information of the first data bits to the nonvolatile memory device along with the first command.

20. A storage device comprising:

a nonvolatile memory device including memory blocks; and a controller connected with the nonvolatile memory device through data input and output lines and a data strobe line, wherein the controller inputs first data bits through the data input and output lines to the nonvolatile memory device, wherein the controller reads second data bits corresponding to the first data bits through the data input and output lines from the nonvolatile memory device, wherein the controller adjusts first data strobe signal based on a result of the reading, wherein the nonvolatile memory device is further configured to receive a read enable signal from the controller and output second data strobe signal to the controller during first training, the second data strobe signal having being delayed from the read enable signal, and wherein the read enable signal toggles with a certain period during a first time interval and stop toggling with the certain period during a second time interval.

21. The storage device of claim 20, wherein the controller aligns centers of the first data bits to an edge of the first data strobe signal.

22. The storage device of claim 20, wherein the nonvolatile memory device and the controller are further configured to perform a second training to align the first data strobe signal and the first data bits before the first training.

23. The storage device of claim 22, wherein the nonvolatile memory device further outputs third data bits to the data input and output line, and the second training comprises, sending, by the controller, a command to the nonvolatile memory device, receiving, by the controller, the third data bits in response to the command in sync with the second data strobe signal, and aligning the third data bits and the second data strobe signal based on the received third data.

24. The storage device of claim 23, wherein the second training further comprises:

sending, by the controller, information of the third data bits along with the command to the nonvolatile memory device.

25. The storage device of claim 20, wherein the controller adjusts a delay of the first data strobe signal when adjusting the first data strobe signal.

26. The storage device of claim 25, wherein the controller maintains delays of the first data bits while adjusting the delay of the first data strobe signal.

27. The storage device of claim 20, wherein the controller is further configured repeat inputting the first data bits and reading the second data bits to adjust delays.

28. The storage device of claim 27, wherein the controller is further configured to adjust a delay of the first data strobe signal after the reading and before the inputting.

29. The storage device of claim 27, wherein the controller maintains the delays of the first data bits while repeating inputting the first data bits and reading the second data bits.

30. The storage device of claim 20, wherein the first training is performed after power-on.

* * * * *